United States Patent
Tanaka

(10) Patent No.: US 10,153,748 B2
(45) Date of Patent: Dec. 11, 2018

(54) ACOUSTIC WAVE ELEMENT, FILTER ELEMENT, AND COMMUNICATION DEVICE

(71) Applicant: KYOCERA Corporation, Kyoto-shi, Kyoto (JP)

(72) Inventor: Hiroyuki Tanaka, Kyoto (JP)

(73) Assignee: Kyocera Corporation, Kyoto (JP)

( * ) Notice: Subject to any disclaimer, the term of this patent is extended or adjusted under 35 U.S.C. 154(b) by 193 days.

(21) Appl. No.: 15/033,593

(22) PCT Filed: Sep. 18, 2014

(86) PCT No.: PCT/JP2014/074679
§ 371 (c)(1),
(2) Date: Apr. 29, 2016

(87) PCT Pub. No.: WO2015/064238
PCT Pub. Date: May 7, 2015

(65) Prior Publication Data
US 2016/0261038 A1    Sep. 8, 2016

(30) Foreign Application Priority Data

Oct. 31, 2013   (JP) ................................ 2013-226893

(51) Int. Cl.
*H03H 9/25* (2006.01)
*H03H 9/64* (2006.01)
(Continued)

(52) U.S. Cl.
CPC .......... *H03H 9/14594* (2013.01); *H01Q 1/52* (2013.01); *H03H 9/02559* (2013.01);
(Continued)

(58) Field of Classification Search
CPC .. H03H 9/02559; H03H 9/02834; H03H 9/08; H03H 9/1071; H03H 9/14547;
(Continued)

(56) References Cited

U.S. PATENT DOCUMENTS 5,694,095 A * 12/1997 Mineyoshi ........... H03H 9/0542
310/313 R
5,854,527 A    12/1998 Shimizu et al.
(Continued)

FOREIGN PATENT DOCUMENTS

JP    S63-110809    5/1988
JP    H05-122002 A  5/1993
(Continued)

OTHER PUBLICATIONS

Office Action dated Mar. 8, 2016, issued in counterpart Japanese application No. 2015-519120.
(Continued)

*Primary Examiner* — Barbara Summons
(74) *Attorney, Agent, or Firm* — Procopio Cory Hargreaves and Savitch LLP

(57) ABSTRACT

In an acoustic wave element of the present invention, a first imaginary line connecting end portions of the plurality of first electrode fingers in the IDT electrode on the second bus bar side and a second imaginary line connecting end portions of the plurality of second electrode fingers in the IDT electrode on the first bus bar side are within ranges of 2 degrees<θA≤10 degrees and 2 degrees<θB≤10 degrees where an angle formed by the first imaginary line and the propagation direction is the first inclination angle θA and an angle formed by the second imaginary line and the propagation direction is the second inclination angle θB.

17 Claims, 24 Drawing Sheets

(51) Int. Cl.
*H03H 9/72* (2006.01)
*H03H 9/145* (2006.01)
*H03H 9/02* (2006.01)
*H03H 9/10* (2006.01)
*H01Q 1/52* (2006.01)
*H03H 9/17* (2006.01)
*H03H 9/56* (2006.01)

(52) U.S. Cl.
CPC ...... *H03H 9/02834* (2013.01); *H03H 9/1071* (2013.01); *H03H 9/14547* (2013.01); *H03H 9/25* (2013.01); *H03H 9/64* (2013.01); *H03H 9/6456* (2013.01); *H03H 9/6483* (2013.01); *H03H 9/725* (2013.01); *H03H 9/17* (2013.01); *H03H 9/56* (2013.01)

(58) Field of Classification Search
CPC ........ H03H 9/14594; H03H 9/17; H03H 9/25; H03H 9/56; H03H 9/64; H03H 9/6456; H03H 9/6483; H03H 9/725; H01Q 1/52
USPC .......... 333/133, 193–196; 310/313 B, 313 D
See application file for complete search history.

(56) References Cited

U.S. PATENT DOCUMENTS

| | | | |
|---|---|---|---|
| 5,895,996 A | 4/1999 | Takagi et al. | |
| 6,031,435 A | 2/2000 | Inose et al. | |
| 6,373,353 B1 | 4/2002 | Takeuchi et al. | |
| 6,593,678 B1* | 7/2003 | Flowers | H03H 9/0542 310/313 R |
| 8,106,726 B2* | 1/2012 | Hashimoto | H03H 9/02992 310/313 B |
| 2002/0021194 A1* | 2/2002 | Maehara | H03H 9/6483 333/193 |
| 2002/0149295 A1* | 10/2002 | Onishi | H03H 9/0222 310/313 R |
| 2003/0117240 A1 | 6/2003 | Inoue et al. | |
| 2004/0222717 A1 | 11/2004 | Matsuda et al. | |
| 2004/0226162 A1* | 11/2004 | Miura | H03H 3/08 29/594 |
| 2005/0025324 A1 | 2/2005 | Takata | |
| 2007/0120623 A1* | 5/2007 | Sakiyama | H03H 9/02574 333/133 |
| 2007/0296306 A1 | 12/2007 | Hauser et al. | |
| 2008/0129418 A1* | 6/2008 | Miura | H03H 9/6483 333/195 |
| 2009/0267707 A1 | 10/2009 | Miura et al. | |
| 2010/0194496 A1* | 8/2010 | Goto | H03H 9/0071 333/136 |
| 2011/0215883 A1* | 9/2011 | Fujiwara | H03H 9/64 333/195 |
| 2013/0051588 A1* | 2/2013 | Ruile | H03H 3/08 381/190 |
| 2013/0099875 A1 | 4/2013 | Shimizu et al. | |
| 2013/0109332 A1 | 5/2013 | Aigner | |
| 2014/0145557 A1 | 5/2014 | Tanaka et al. | |

FOREIGN PATENT DOCUMENTS

| | | |
|---|---|---|
| JP | H09-135142 | 5/1997 |
| JP | H09-153753 A | 6/1997 |
| JP | H09-331229 A | 12/1997 |
| JP | H11-220353 A | 8/1999 |
| JP | 2003-198317 A | 7/2003 |
| JP | 2004-336503 A | 11/2004 |
| JP | 2005-045475 A | 2/2005 |
| JP | 2006-094567 A | 4/2006 |
| JP | 2006-186435 A | 7/2006 |
| JP | 2007-134889 A | 5/2007 |
| JP | 2007-214902 A | 8/2007 |
| JP | 2007-325084 A | 12/2007 |
| JP | 2008-514062 A | 5/2008 |
| JP | 2008-289031 A | 11/2008 |
| JP | 2009-232242 A | 10/2009 |
| JP | 2012-010054 A | 1/2012 |
| JP | 2013-098991 A | 5/2013 |
| WO | 96/10293 | 4/1996 |
| WO | 2011/142380 | 11/2011 |
| WO | 2012/140831 | 10/2012 |
| WO | 2013/002033 | 1/2013 |
| WO | 2013/073472 | 5/2013 |

OTHER PUBLICATIONS

Office Action dated Mar. 7, 2017 issued in counterpart Japanese Application No. 2016-093933.
International Search Report issued by the Japanese Patent Office for International Application No. PCT/JP2014/074679, dated Dec. 9, 2014.

* cited by examiner

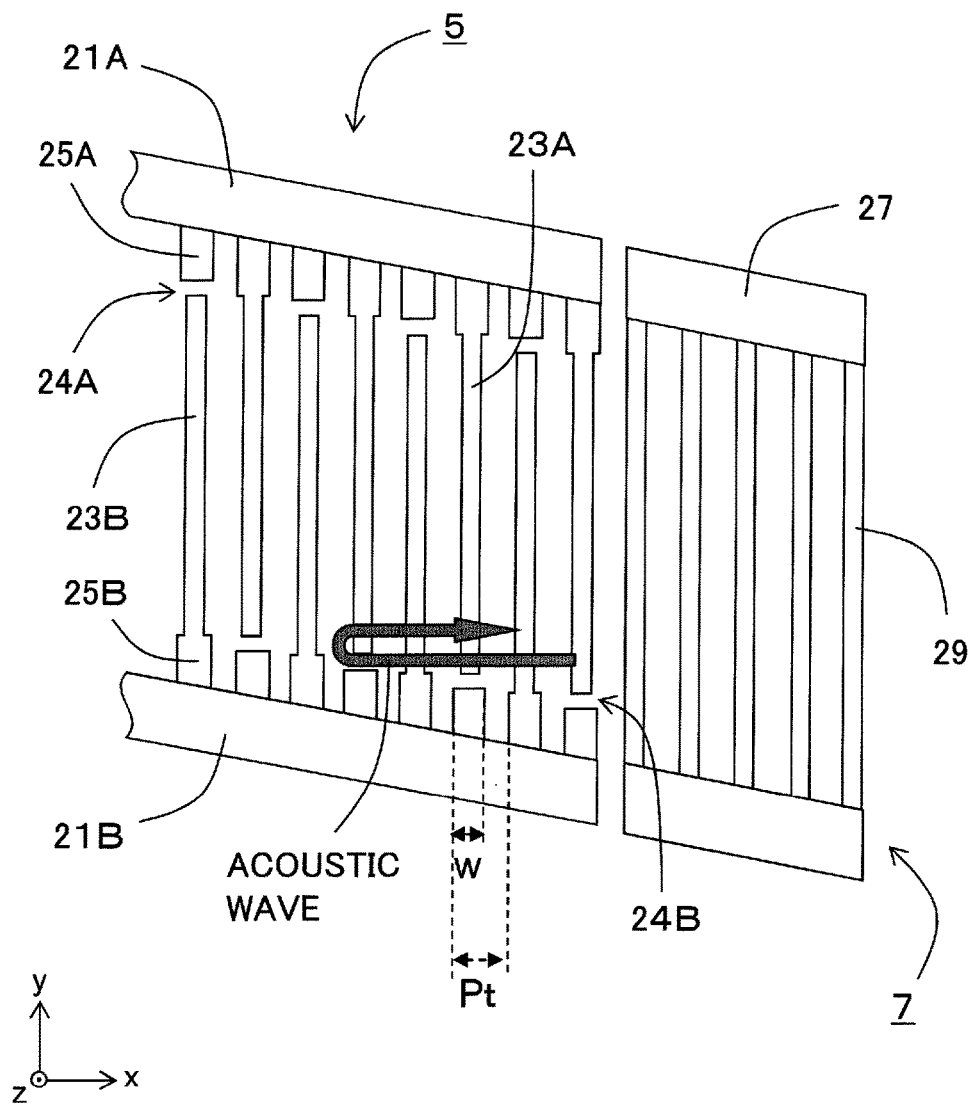

ACOUSTIC WAVE ELEMENT, FILTER ELEMENT, AND COMMUNICATION DEVICE

TECHNICAL FIELD

The present invention relates to an acoustic wave element, filter element, and communication device.

BACKGROUND ART

Known in the art is an acoustic wave element having a piezoelectric substrate and an excitation electrode provided on the major surface of the piezoelectric substrate. Such an acoustic wave element is for example utilized for a reception filter (Rx filter) or transmission filter (Tx filter) of a branching filter.

Here, in the branching filter, when the interval between the Tx band and the Rx band is narrow, since the frequency ends up moving due to a change of the ambient temperature (−30° C. to +85° C.), it was difficult to satisfy the transmittance property and attenuation property which are required for the Tx band and Rx band. As a technique for solving this, there is the technique of using a temperature-compensated piezoelectric substrate (see Japanese Patent Publication No. 2007-214902A etc.)

SUMMARY OF INVENTION

Technical Problem

In this regard, in such a branching filter having a narrow interval between the Tx band and the Rx band, in addition to dealing with frequency movement due to change of the ambient temperature, a high steepness is required for the filter characteristics.

The present invention was made in consideration of such circumstances and has as an object thereof is to provide an acoustic wave element capable of improving the filter characteristics, a filter element having the same, and a communication device provided with the same.

Solution to Problem

An acoustic wave element according to an embodiment of the present invention has a piezoelectric substrate; and an IDT (InterDigital Transducer) electrode which is arranged on the upper surface of the piezoelectric substrate and excites an acoustic wave. The IDT electrode has a first bus bar and a second bus bar which face each other in a direction crossing a propagation direction of the acoustic wave, a plurality of first electrode fingers which extend from the first bus bar to the second bus bar side, and a plurality of second electrode fingers which extend from the second bus bar to the first bus bar and have portions that are adjacent to the plurality of first electrode fingers in the propagation direction. A first imaginary line connecting end portions of the plurality of first electrode fingers in the IDT electrode on the second bus bar side and a second imaginary line connecting end portions of the plurality of second electrode fingers in the IDT electrode on the first bus bar side are within ranges of 2 degrees<θA≤10 degrees and 2 degrees<θB≤10 degrees where an angle formed by the first imaginary line and the propagation direction is the first inclination angle θA and an angle formed by the second imaginary line and the propagation direction is the second inclination angle θB.

A filter element according to an embodiment of the present invention has the acoustic wave element explained above, and a serial resonator connected in series to the acoustic wave element and a parallel resonator connected in parallel to the acoustic wave element which are arranged on the piezoelectric substrate.

A communication device according to an embodiment of the present invention has an antenna, the above filter element electrically connected to the antenna, and an RF-IC electrically connected to the filter element.

Advantageous Effects of Invention

According to the acoustic wave element of the present invention and the filter element provided with the same, a reduction of insertion loss or improvement of steepness of the passband can be achieved and the filter characteristics can be improved.

Further, according to the communication device provided with these acoustic wave element and filter element, good communication can be carried out by improvement of the filter characteristics of those elements.

BRIEF DESCRIPTION OF DRAWINGS

FIG. 16 is a diagrammatical view for explaining the effects of the acoustic wave element in FIG. 14.

DESCRIPTION OF EMBODIMENTS

Below, an acoustic wave (SAW: surface acoustic wave) element according to an embodiment of the present invention will be explained with reference to the drawings. Note that, the diagrams used in the following explanation are schematic ones. Proportions etc. on the drawings do not always match the actual ones.

In an acoustic wave element (below, also referred to as a "SAW element"), any direction may be defined as upward or downward. In the following description, for convenience, an orthogonal coordinate system xyz will be defined, and an "upper surface", "lower surface", and other terms will be used where the positive side in the z-direction is the upper part.

(Summary of Configuration of SAW Element)

Figure 1:
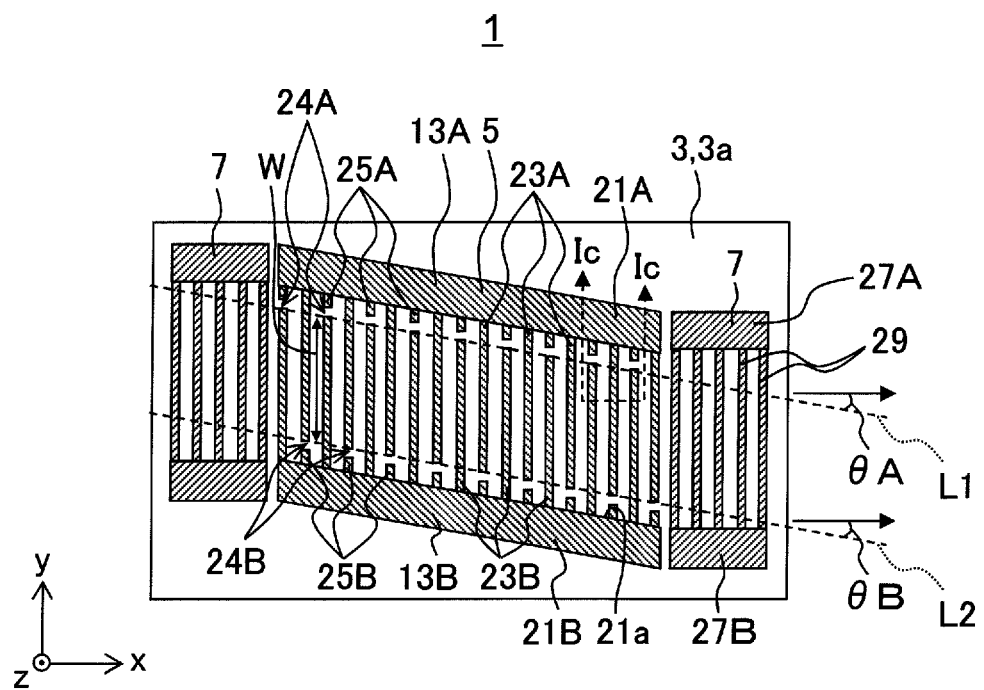
FIG. 1 is a plan view showing the configuration of an acoustic wave element according to an embodiment of the present invention.
Figure 2:
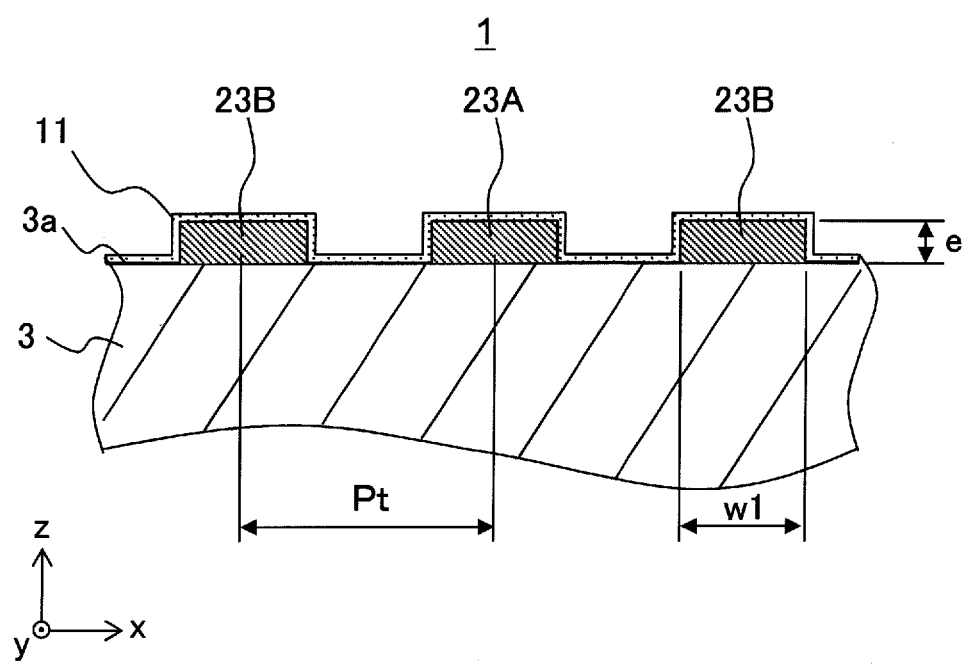
FIG. 2 is a cross-sectional view corresponding to a cross-section cut along the Ic-Ic line in the acoustic wave element in FIG. 1.

FIG. 1 is a plan view showing the configuration of a SAW element 1 according to an embodiment of the present invention. FIG. 2 is a cross-sectional view taken along the Ic-Ic line in FIG. 1.

The SAW element 1, as shown in FIG. 1, has a substrate 3, an excitation (IDT: InterDigital Transducer) electrode 5, and reflectors 7 which are provided on an upper surface 3a of the substrate 3. Further, the SAW element 1, other than these, may have a protective layer covering the upper surface 3a and have lines for inputting and/or outputting signals to and/or from the IDT electrode 5 and so on as well.

The substrate 3 is configured by a substrate of single crystal having piezoelectricity made of lithium tantalate (LiTaO$_3$) crystal. More specifically, the substrate 3 is comprised of 36° to 48° Y-X cut LiTaO$_3$. The planar shape and various dimensions of the substrate 3 may be suitably set. As an example, the thickness (z-direction) of the substrate 3 is for example 0.2 mm to 0.7 mm.

The IDT electrode 5, as shown in FIG. 1, is configured by a pair of comb-shaped electrodes 13 comprised of a first comb-shaped electrode 13A and a second comb-shaped electrode 13B. Note that, in the following description, the first comb-shaped electrode 13A and second comb-shaped electrode 13B will be sometimes simply referred to as the "comb-shaped electrodes 13" and not differentiated. Further, for the configuration etc. concerned with the first comb-shaped electrode 13A, the terms "first" and "A" will be sometimes attached such as for example the "first bus bar 21A". For the configuration etc. concerned with the second comb-shaped electrode 13B, the terms "second" and "B" will be sometimes attached such as for example the "second bus bar 21B". Further, these "first", "second", "A", and "B" will be sometimes omitted.

The comb-shaped electrodes 13, as shown in FIG. 1, have two bus bars 21 facing each other, pluralities of electrode fingers 23 which extend from the respective bus bars 21 toward the other bus bar 21 side and pluralities of dummy electrode fingers 25 which extend from the respective bus bars 21 toward the other bus bar 21 side between two or more electrode fingers 23. Further, the pair of comb-shaped electrodes 13 are arranged so that their pluralities of electrode fingers 23 intersect (mesh) with each other. Note that, the dummy electrode fingers 25 need not be provided.

The acoustic wave is propagated in a direction perpendicular to the pluralities of electrode fingers 23. Accordingly, after considering the crystal orientation of the substrate 3, the two bus bars 21 are arranged so as to face each other in a direction crossing the direction in which the acoustic wave is to be propagated, and the pluralities of electrode fingers 23 are formed so as to extend in the direction perpendicular to the direction in which the acoustic wave is to be propagated.

Note that, the propagation direction of the acoustic wave is set according to the orientations etc. of the pluralities of electrode fingers 23. In the present embodiment, for convenience, the orientations etc. of the pluralities of electrode fingers 23 will be sometimes explained using the propagation direction of the acoustic wave as a reference.

Further, it is assumed that the orthogonal coordinate system xyz is defined so that the x-axis is perpendicular to the electrode fingers 23 (parallel to the propagation direction of the acoustic wave), the y-axis is parallel to the electrode fingers 23, and the z-axis is perpendicular to the IDT electrode 5. That is, the orthogonal coordinate system xyz is defined using not the outer shape of the substrate 3, but the IDT electrode 5 (propagation direction of acoustic wave) as a reference.

The bus bars 21 are formed in long shapes so as to linearly extend with roughly constant widths and are inclined relative to the propagation direction of the acoustic wave (x-direction). Accordingly, the edge parts 21a of the bus bars 21 on the sides facing each other are linear in shape and inclined relative to the propagation direction of the acoustic wave. The inclination angles of the bus bars 21 (edge parts 21a) are for example the same as each other between the two bus bars 21. Note that, the bus bars 21 may be integrally formed with the lines as well. Note that, the bus bars 21 need not be inclined relative to the propagation direction of the acoustic wave as well.

The pluralities of electrode fingers 23 are formed in long shapes so as to linearly extend with roughly constant widths and are arranged in the propagation direction of the acoustic wave at roughly constant intervals. The pluralities of electrode fingers 23 of the pair of comb-shaped electrodes 13, as shown in FIG. 2, are provided so that a repetition interval of the intervals between centers of adjacent electrode fingers 23, that is, a pitch Pt, becomes equal to a half-wavelength of a wavelength λ of the acoustic wave at the frequency at which resonation is desired to be caused. Note that, as the repetition interval of the pitch Pt, use may be made of the interval from one end to the other end on the same side of the adjacent electrode fingers 23 as well. Further, as the pitch Pt of the pluralities of electrode fingers 23, use can be made of a mean value of the interval between the centers of two adjacent electrode fingers 23.

The wavelength λ (2 Pt) is for example set to 1.5 μm to 6 μm. The width w1 of each electrode finger 23 is suitably set in accordance with the electrical characteristics etc.

which are demanded from the SAW element 1. For example, it is set to 0.3 Pt to 0.7 Pt with respect to the pitch Pt. The crossing width (depth of engagement) of the first electrode finger 23A and the second electrode finger 23B is for example set to 10λ to 70λ.

The lengths of the pluralities of electrode fingers 23 are set so as to become substantially the same. Further, as explained above, the edge parts 21a of the two bus bars 21 (the root positions of the electrode fingers 23) are inclined in the propagation direction of the acoustic wave and are linear in shape so as to be parallel to each other. Accordingly, the first imaginary line L1 connecting the end portions of the plurality of first electrode fingers 23A on the second bus bar 21B side and the second imaginary line L2 connecting the end portions of the second electrode fingers 23B on the first bus bar 21A side are inclined in the same direction with respect to the propagation direction of the acoustic wave.

Here, the first imaginary line L1 only have to be a line which connects the end portions of the plurality of first electrode fingers 23A and is ideally drawn straight. When the positions of the end portions of the first electrode fingers 23A differ, an ideal straight line linking the end portions of the first electrode fingers 23A positioned at the end parts with each other may be defined as the first imaginary line L1. The end portions of the first electrode fingers 23A used for drawing the first imaginary line L1 designate an entire side facing the second bus bar 21B.

As in the present embodiment, when the first electrode fingers 23A are formed in rectangular shapes, the first imaginary line L1 only have to pass through the sides of the first electrode fingers 23A facing the second bus bar 21B. Note that, the first imaginary line L1 may be defined so as to be superposed over first gaps 24A which will be explained later. The definition of the second imaginary line L2 is the same as that of the first imaginary line L1.

The inclination angle θA of the first imaginary line L1 relative to the propagation direction of the acoustic wave and the inclination angle θB of the second imaginary line L2 relative to the propagation direction of the acoustic wave are for example set so as to become the same as each other. A preferred range of the inclination angle θ will be explained later. Note that, the inclination angle θ is defined or measured for each end portion of two adjacent electrode fingers 23. Further, the magnitude of the inclination angle θA and the inclination angle θB may be different as well.

The pluralities of dummy electrode fingers 25 are for example formed in long shapes so as to linearly extend with roughly a constant width. The first dummy electrode fingers 25A extend from the first bus bar 21A to the second electrode finger 23B side. Also, the second dummy electrode fingers 25B extend from the second bus bar 21B toward the first electrode finger 23A side in the same way as the first dummy electrode fingers 25A. Each of the plurality of dummy electrode fingers 25 is arranged between the electrode fingers 23 in the x-direction (in a case where it is a first dummy electrode finger 25A, it is arranged between the first electrode fingers 23A).

Further, the dummy electrode fingers 25 are configured so that the front ends of the dummy electrode fingers 25 of one comb-shaped electrode 13 face the front ends of the electrode fingers 23 of the other comb-shaped electrode 13 through gaps 24. The widths (x-direction) of the dummy electrode fingers 25 may be different from the widths of the electrode fingers 23. However, they are for example set equal to the widths of the electrode fingers 23. The lengths of the pluralities of dummy electrode fingers 25 (y-direction) are for example the same as each other. Here, the gaps 24 on the first bus bar 21 side will be referred to as the "first gaps 24A", and the gaps 24 on the second bus bar 21B side will be referred to as the "second gaps 24B".

The gap lengths G (lengths of the gaps 24 in the y-direction) are for example the same as each other between two or more gap lengths G. The gap lengths G are for example 0.10 μm to 1.00 μm. Further, when the wavelength of the acoustic wave is λ, the gap lengths G are for example 0.1λ to 0.6λ.

The IDT electrode 5 is for example formed by a metal material. As this metal material, for example, there can be mentioned Al or an alloy containing Al as a principal ingredient (Al alloy). The Al alloy is for example Al—Cu alloy. Note that, the IDT electrode 5 may be configured by a plurality of metal layers as well. Various dimensions of the IDT electrode 5 are suitably set in accordance with the electrical characteristics etc. which are demanded from the SAW element 1. As an example, the thickness (z-direction) of the IDT electrode 5 is for example 50 nm to 400 nm.

The IDT electrode 5 may be directly arranged on the upper surface 3a of the substrate 3 or may be arranged on the upper surface 3a of the substrate 3 through another member. As the other member, for example use can be made of Ti, Cr, or an alloy of them. When the IDT electrode 5 is arranged on the upper surface 3a of the substrate 3 through another member, the thickness of the other member is set to a thickness to an extent where almost no influence is exerted on the electrical characteristics of the IDT electrode 5 (for example a thickness of 5% of the thickness of the IDT electrode 5 in the case of Ti).

When voltage is supplied to the substrate 3 by the IDT electrode 5, near the upper surface 3a of the substrate 3, an acoustic wave which is propagated in the x-direction along the upper surface 3a is excited. Further, the acoustic wave is reflected at a boundary between the electrode fingers 23 and a region in which the electrode finger 23 is not arranged (a long shaped region between adjacent electrode fingers 23). Then, a standing wave defining the pitch Pt of the electrode fingers 23 as the half-wavelength is formed. The standing wave is converted to an electrical signal having the same frequency as that of the standing wave and is extracted by the electrode fingers 23. In this way, the SAW element 1 functions as a resonator or filter.

The reflector 7 is formed in a lattice state. That is, the reflector 7 has reflector bus bars 27 which face each other in a direction crossing the propagation direction of the acoustic wave and a plurality of reflector electrode fingers 29 which extend in the direction perpendicular to the propagation direction of acoustic wave between these bus bars 27.

Figure 3:
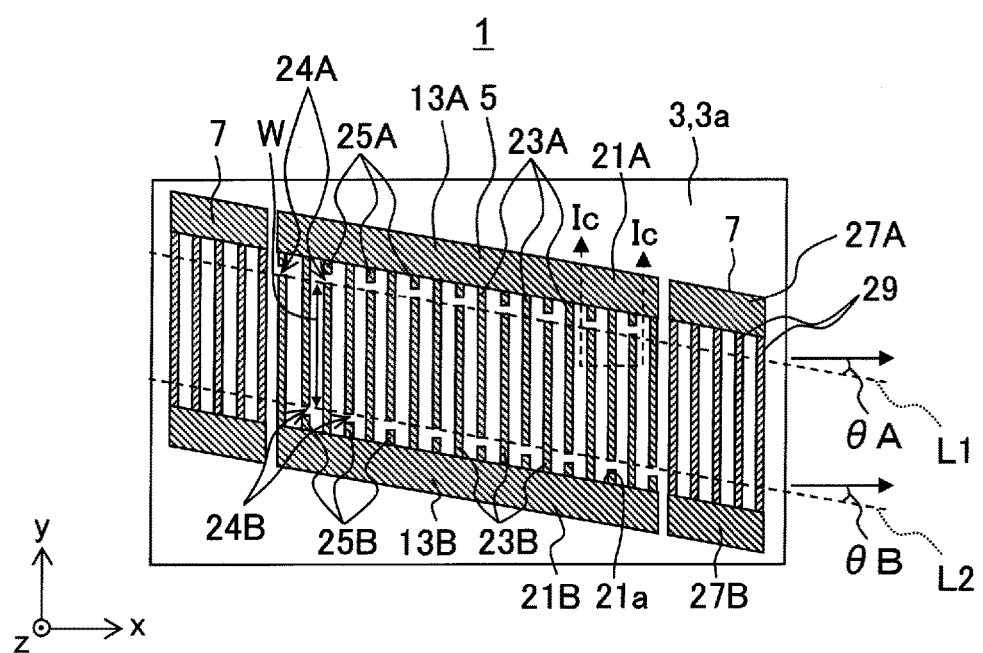
FIG. 3 is a plan view showing the configuration of a modification of the acoustic wave element in FIG. 1.

The reflector bus bars 27 are for example formed in a long length shape linearly extending with roughly a constant width and are arranged parallel to the propagation direction of the acoustic wave. The distance between the two reflector bus bars 27 is for example substantially the same as the distance between the two bus bars 21 of the IDT electrode 5. Further, for example, as shown in FIG. 3, the reflector bus bars 27 may be inclined so as to have the same inclination angle as that of the bus bars 21 (edge parts 21a) relative to the propagation direction of acoustic wave as well. By giving the same inclination angle to the bus bars 21 and the reflector bus bars 27, when providing a plurality of SAW elements 1 on the upper surface 3a of the substrate 3, it becomes possible to arrange them in a smaller space. For this reason, this can contribute to reduction of size and can improve the degree of freedom of design.

Further, the plurality of reflector electrode fingers 29 are formed in a long length shape linearly extending with roughly a constant width and are arranged at a pitch Pt which is substantially equal to that of the electrode fingers 23 of the IDT electrode 5. The widths of the reflector electrode fingers 29 are for example substantially equal to the widths of the electrode fingers 23. The reflectors 7 are formed by for example the same material as that for the IDT electrode 5 and are formed to a thickness equal to that of the IDT electrode 5.

A protective layer 11 for example covers the IDT electrode 5 and reflectors 7 and covers portions of the upper surface 3a which are exposed from the IDT electrode 5 and the reflectors 7. The thickness of the protective layer 11 is set to for example 1 nm to 50 nm.

The protective layer 11 is made of a material having an insulation property and contributes to protection of the IDT electrode 5 from corrosion etc. The protective layer 11 is formed by $SiO_2$ or another material. By burying the IDT electrode 5 by $SiO_2$, the influence of a change of the temperature upon the electrical characteristics of the SAW element 1 can be reduced.

Figure 4A:
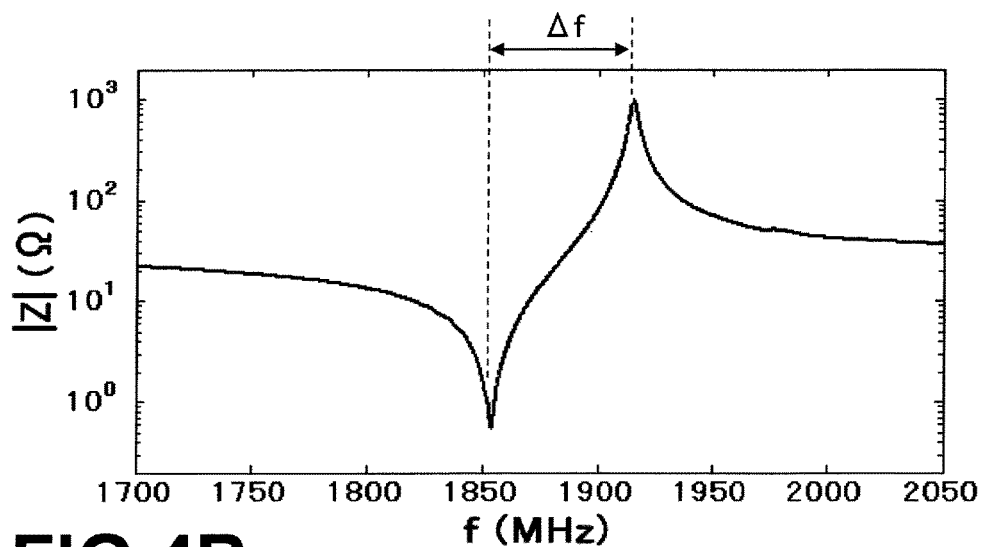
FIGS. 4A and 4B are diagrams showing an impedance characteristic when an inclination angle θ is 0 degree in the acoustic wave element in FIG. 1.
Figure 4B:
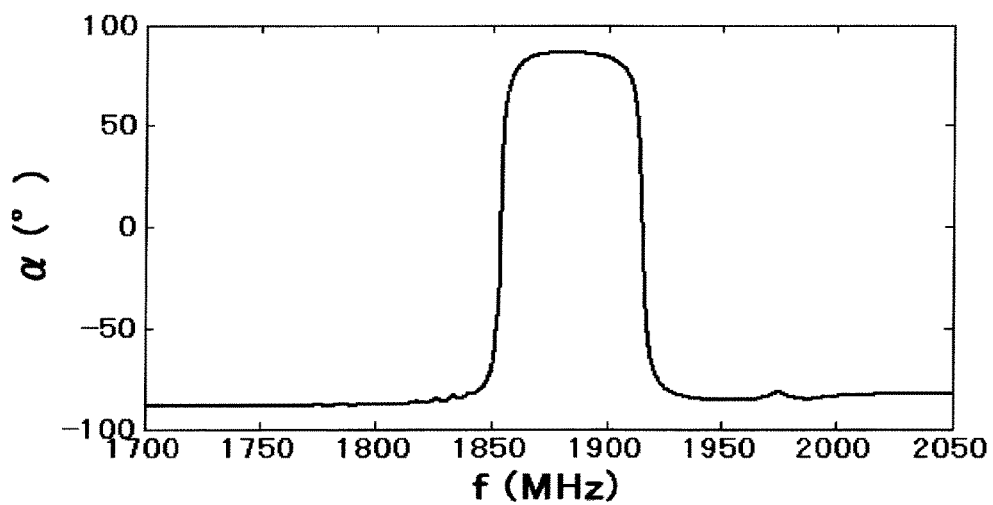

FIG. 4A and FIG. 4B are graphs showing impedance characteristics of an SAW element having an inclination angle θ of 0 degree. An abscissa indicates the frequency "f". In FIG. 4A, an ordinate indicates the absolute value |Z| of the impedance, while the ordinate in FIG. 4B indicates the phase α of the impedance Z. Note that, the configuration of this SAW element where the inclination angle θ is 0 degree is the same as that of the SAW element in a comparative example which will be explained later.

As shown in FIG. 4A, in the SAW element 1, a resonance point at which the absolute value |Z| of the impedance becomes the minimum and an anti-resonance point at which the absolute value |Z| of the impedance becomes the maximum appear. Further, as shown in FIG. 4B, between the resonance point and the anti-resonance point, the phase α of the impedance Z becomes the maximum phase αmax.

Next, in order to confirm the effects of the SAW element 1 in the present embodiment, a plurality of SAW elements having different inclination angles θ (SAW elements in comparative example and examples) were prepared and were measured. Note that, for convenience, the angles were set so that the inclination angle θA and the inclination angle θB became the same. The comparative example shows a SAW element having an inclination angle θ of 0 degree, and the examples show 11 SAW elements 1 prepared so that their inclination angles are different at an interval of 2 degrees from 2 degrees up to 22 degrees.

Figure 5:
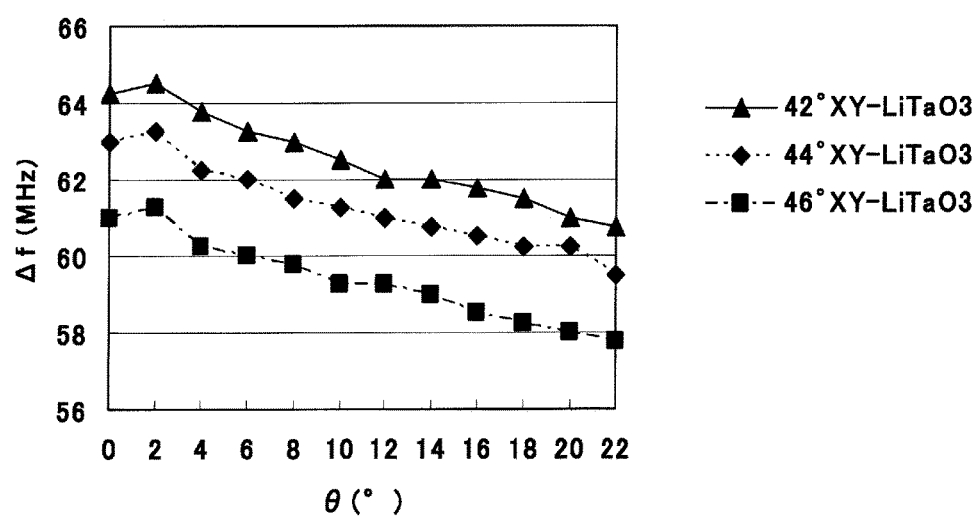
FIG. 5 is diagram showing results when the acoustic wave element in FIG. 1 is prepared and measured.

FIG. 5 is a graph showing measurement results of Δf at the time when use was made of 42° YX—$LiTaO_3$, 44° YX—$LiTaO_3$, and 46° YX—$LiTaO_3$ for the substrate 3, and the inclination angle θ of the SAW element 1 was changed. Here, Δf designates the interval from the resonance point to the anti-resonance point of the SAW element 1 as shown in FIG. 4A. The abscissa indicates the inclination angle θ(°), and the ordinate indicates Δf (MHz).

Conditions common to the comparative example and the examples will be shown below.
IDT electrode 5/reflector 7:
  Material: Al—Cu alloy
  (Note, there is 6 nm of underlying layer made of Ti between the substrate 3 and the conductive layer 15.)
  Thickness e (Al—Cu alloy layer): 154 nm
Protective layer 11:
  Material: $SiO_2$
  Thickness T: 15 nm
Electrode fingers of IDT electrode:
  Pitch Pt (interval between centers of first electrode finger 23A and second electrode finger 23B): 1.06 μm
  Duty (w1/Pt): 0.5
  Number: 300
  Crossing width W: 42.4 μm
  Length of dummy electrode finger: 4.24 μm
  Number of electrode finger of reflector: 30

It was seen from the results in FIG. 5 that, when making the inclination angle θ larger than 2 degrees, Δf could be made smaller compared with the case where the inclination angle is 0 degree. That is, by setting the first inclination angle θA and second inclination angle θB larger than 2 degrees and arranging the end portions of the electrode fingers so that they line-up along the first and second imaginary lines L1 and L2, Δf can be made small. As a result, a SAW element capable of raising the steepness of the filter characteristics is obtained.

By inclining the first imaginary line L1 and second imaginary line L2 in the same direction relative to the propagation direction of the acoustic wave in this way, the difference of the cross range of the pluralities of electrode fingers 23 (crossing width W (FIG. 1)) can be made smaller, therefore the durability when applying a high electric power can be improved.

(Preferred Range of Inclination Angle θ)

Figure 6:
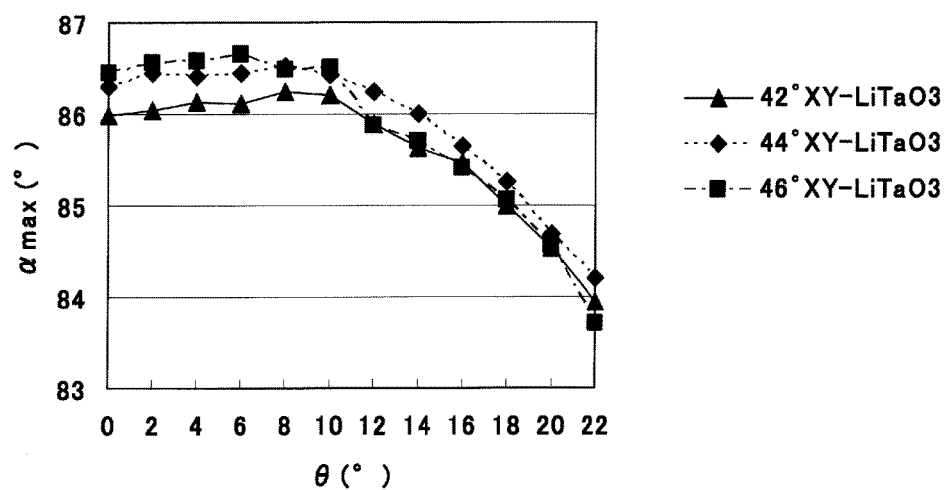
FIG. 6 is diagram showing results when the acoustic wave element in FIG. 1 is prepared and measured.

FIG. 6 is a diagram showing measurement results of the maximum phase αmax of the phase α of impedance at the case where use was made of 42° YX—$LiTaO_3$, 44° YX—$LiTaO_3$, and 46° YX—$LiTaO_3$ for the substrate 3, and the inclination angle θ of the SAW element 1 was changed. The abscissa indicates the inclination angle θ(°), and the ordinate indicates αmax(°). In all of three types of substrates 3, when making the inclination angle θ larger from θ=0° to θ=10°, the maximum phase αmax can be made larger and the propagation loss can be made smaller.

Figure 7A:
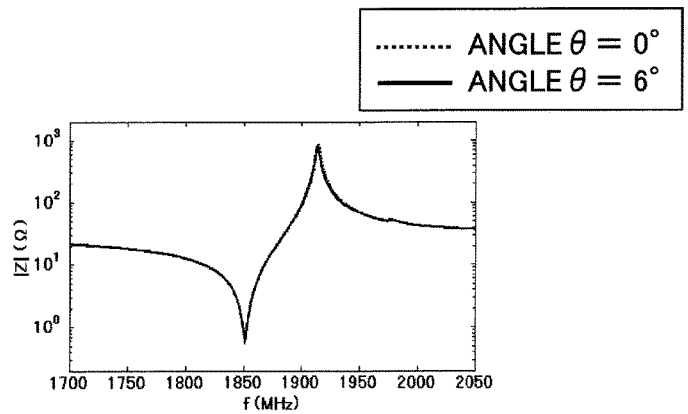
FIGS. 7A to 7D are diagrams showing results when the acoustic wave element in FIG. 1 is prepared and measured.
Figure 7B:
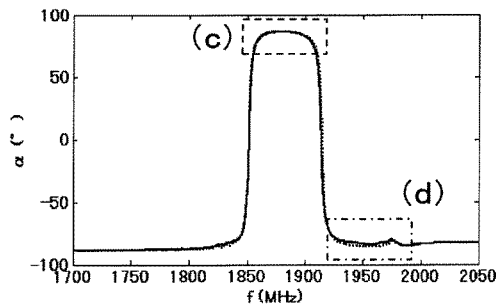
Figure 7C:
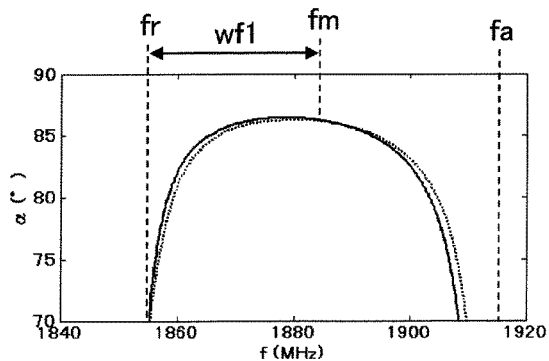
Figure 7D:
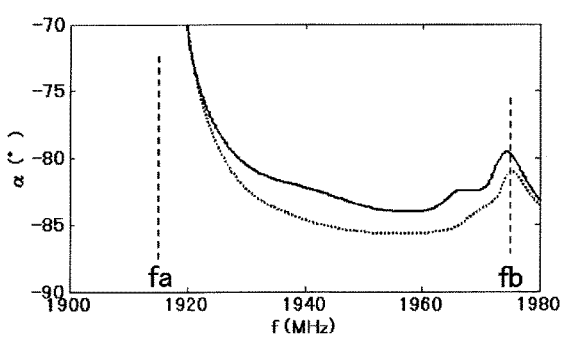

FIGS. 7A to 7D are graphs showing the impedance characteristics of the SAW element 1 using the 46° YX—$LiTaO_3$ for the substrate 3 and where the inclination angles θ are 0 degree and 6 degrees. The dotted lines in FIGS. 7A to 7D indicate an SAW element having an inclination angle θ of 0 degree, and the solid lines indicate an SAW element having an inclination angle θ of 6 degrees. The abscissas indicate the frequency "f". In FIG. 7A, the ordinate indicates the absolute value |Z| of the impedance, and the ordinate in FIG. 7B indicates the phase α of the impedance Z. FIG. 7C is a diagram enlarging the portion which is surrounded by the dotted line in FIG. 7B. FIG. 7D is a diagram enlarging the portion surrounded by the one-dot chain line in FIG. 7B.

It is seen from this result that the maximum phase αmax has become larger in the case where the inclination angle θ is 6 degrees than the case where the inclination angle θ is 0 degree. Further, it is seen that the phase is larger as a whole in the case where the inclination angle θ is 6 degrees than the case where the inclination angle θ is 0 degree in a frequency band wf1 from the resonance frequency to roughly an intermediate frequency fm between the resonance frequency fr and the anti-resonant frequency fa. That is, it shows the fact that, in the frequency band wf1, the propagation loss is smaller in the case where the inclination angle θ is 6 degrees than the case where the inclination angle θ is 0 degree.

As described above, when the inclination angle θ is made larger than 2 degrees, Δf can be made small, therefore the steepness of the filter characteristics can be improved. Further, when the inclination angle θ is made 10 degrees or less, the maximum phase αmax can be made large, therefore the propagation loss can be made small. That is, in a substrate 3 made of $LiTaO_3$, by inclining the electrode fingers 23 of the IDT electrode 5, the steepness is made high and the propagation loss can be reduced.

Further, by setting the magnitude of the inclination angle θ as 2°<θ≤10°, Δf can be made small and the maximum phase αmax can be made large. As a result, the SAW element capable of raising the steepness of the filter characteristics and reducing the propagation loss within the frequency band wf1 can be obtained.

(Modification 1 of SAW Element)

Figure 8:
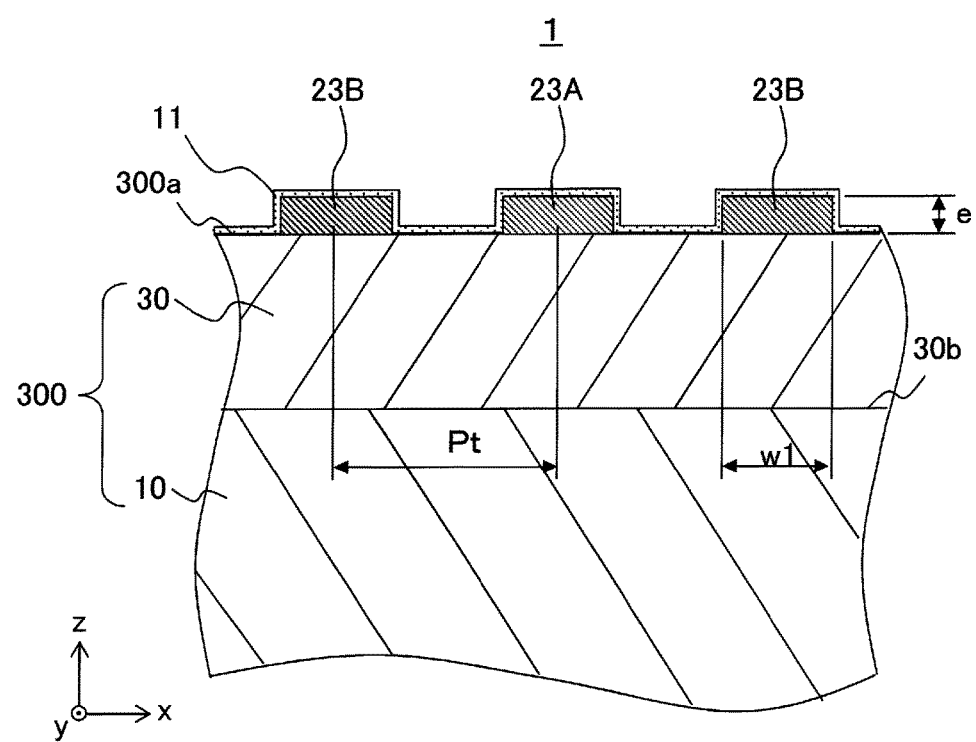
FIG. 8 is a cross-sectional view corresponding to a cross-section cut along the Ic-Ic line in FIG. 1 in an acoustic wave element according to a modification of one embodiment of the present invention.

FIG. 8 is a cross-sectional view showing a principal part of the SAW element 1 according to a modification of one embodiment of the present invention. The SAW element 1 in the present embodiment differs from the embodiment explained above in the point that a bonded substrate 300 is used.

The SAW element 1 has the bonded substrate 300 and has the IDT electrode 5 and reflectors 7 the same as those in FIG. 1 arranged on an upper surface 300a of the bonded substrate 300. The bonded substrate 300 has a substrate 30 and a support substrate 10 adhered to a lower surface 30b of the substrate 30.

The substrate 30 is configured by a substrate having a piezoelectric property such as a single crystal of lithium tantalate ($LiTaO_3$). More suitably, the substrate 30 is configured by 36° to 48° Y-X cut $LiTaO_3$.

The support substrate 10 is formed so that the support substrate 10 having a smaller thermal expansion coefficient than the thermal expansion coefficient of the $LiTaO_3$ substrate is provided directly or through a bonding layer on the surface (30b) of the substrate 30 facing the surface (300a) on which the IDT electrode is formed. The present modification is bonding by so-called direct bonding of activating the bonding surface by plasma or the like, and then bonding the same without a bonding layer. Note that, as the thermal expansion coefficient, use can be made of a linear expansion coefficient etc. of the material.

By configuration of the support substrate 10 by a material having a smaller thermal expansion coefficient than that of the material for the substrate 3, the change of the electrical characteristics of the SAW element 1 due to the temperature can be compensated for. As such a material, for example, there can be mentioned sapphire or another crystal material, polycrystalline or single crystal silicon, or another semiconductor material and ceramic material such as an aluminum oxide sintered body. Note that, the support substrate 10 may be configured by lamination of a plurality of layers which are made of materials different from each other as well.

The thickness of the substrate 30 is for example constant. The size thereof may be suitably set in accordance with the technical field to which the SAW element 1 is applied, the specifications demanded from the SAW element 1, and so on. As an example, the thickness of the substrate 30 is for example 2 μm to 30 μm. The planar shape and various dimensions of the piezoelectric substrate 3 may be suitably set.

The thickness of the support substrate 10 may be suitably set in the same way as the thickness of the substrate 30. Note, the thickness of the support substrate 10 is set by considering the thickness of the substrate 30 so that the temperature compensation is suitably carried out. As an example, in contrast to the thickness of the substrate 30 being 2 μm to 30 μm, the thickness of the support substrate 10 is 100 μm to 300 μm. The planar shape and various dimensions of the support substrate 10 are for example equal to those of the substrate 30.

The substrate 30 and the support substrate 10 may be for example bonded to each other through a not shown bonding layer as well. The material of the bonding layer may be an organic material or inorganic material. As the organic material, there can be mentioned for example a thermosetting resin or another resin. As the inorganic material, for example there can be mentioned $SiO_2$. As the material of the bonding layer, a material which is less effective in reflecting a bulk wave than the support substrate 10 may be used as well. In that case, the influence of the bulk wave can be reduced.

A plurality of SAW elements (SAW elements of comparative example and examples) having different inclination angles θ were prepared and measured. Note that, the angles are set so that the inclination angle θA and the inclination angle θB become the same. The comparative example shows a SAW element having an inclination angle θ of 0 degree, and the examples show 11 SAW elements prepared so that their inclination angles are different at an interval of 2 degrees from 2 degrees up to 22 degrees.

Figure 9:
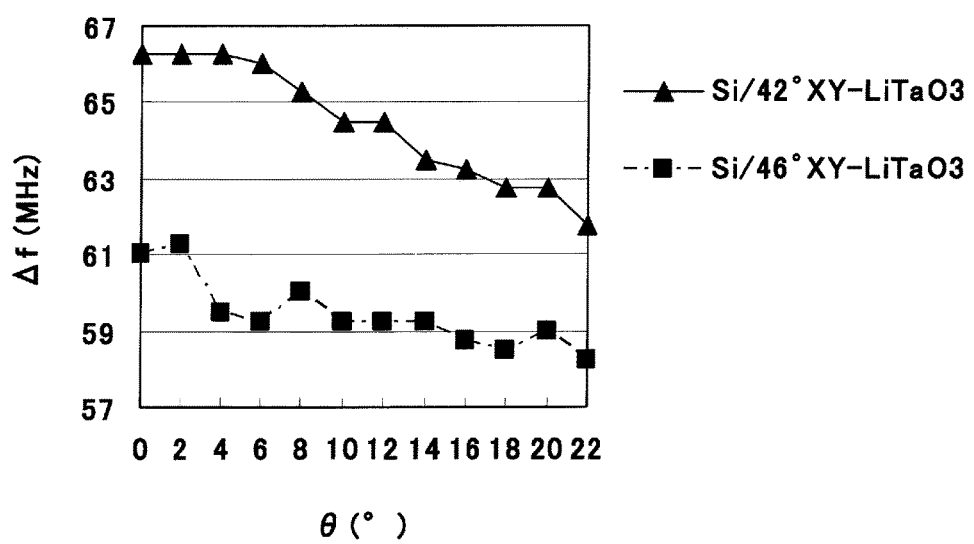
FIG. 9 is a diagram showing results when the acoustic wave element in FIG. 8 is prepared and measured.

FIG. 9 is a graph showing the measurement results of Δf at the case where use was made of 42° YX—$LiTaO_3$ and 46° YX—$LiTaO_3$ for the substrate 3, and the inclination angle θ of the SAW element 1 was changed. The abscissa shows the inclination angle θ (°), and the ordinate shows Δf (MHz).

The configurations on the upper surface 300a of the substrate 30 such as the IDT electrode 5 and the reflectors 7 are the same as those in the embodiment explained above. The conditions of the bonded substrate 300 forming the principal part of the present modification will be shown below.

Bonded substrate 300:
Substrate 3
Type: 42° YX—$LiTaO_3$ and 46° YX—$LiTaO_3$
Thickness: 20 μm
Support substrate 10
Type: Silicon
Thickness: 230 μm
Bonding method: Direct bonding According to the measurement results shown in FIG. 9, it is seen that the Δf becomes smaller when making the inclination angle θ larger. That is, by setting the first inclination angle θA and second inclination angle θB larger than 0 degree and arranging the end portions of the electrode fingers so that they line-up along the first and second imaginary lines L1 and L2, Δf can be made small. As a result, the SAW element 1 can improve the steepness of the filter characteristics. Note that, compared with FIG. 5 showing the SAW element 1 of the embodiment explained above, the change of Δf with respect to the inclination angle θ is not smooth. The reason for this is considered to be that the spurious emission by the bulk wave exerts an influence upon the impedance characteristic in the present modification.

Figure 10:
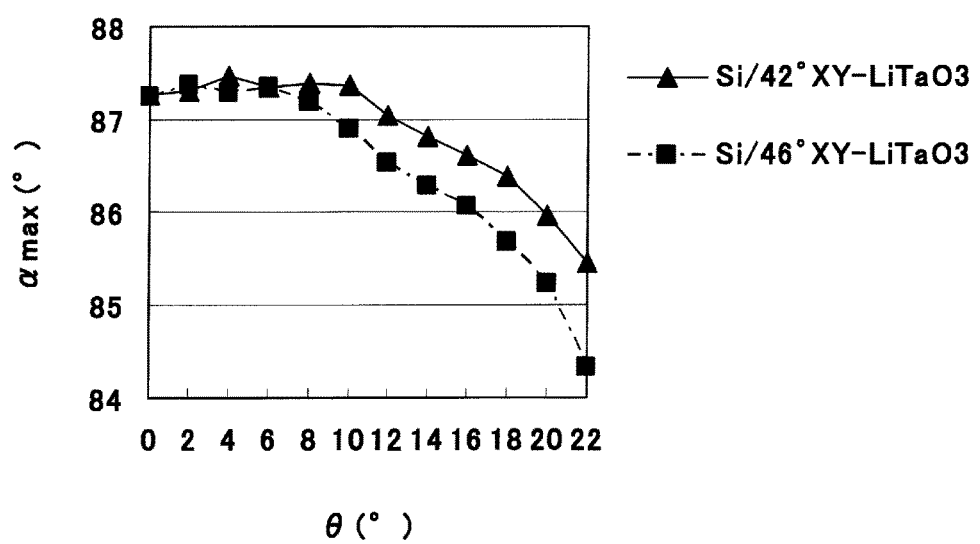
FIG. 10 is a diagram showing results when the acoustic wave element in FIG. 8 is prepared and measured.

Further, FIG. 10 is a diagram showing the measurement results of the maximum phase αmax of the phase α of the impedance at the case where use is made of the 42° YX—$LiTaO_3$ and 46° YX—$LiTaO_3$ for the substrate 30, and the inclination angle θ of the SAW element 1 in the present modification is changed. The abscissa shows the inclination angle θ(°), and the ordinate shows the αmax(°).

In both of the two types of bonded substrates 300 having different cut angles, in a range from the inclination angle θ=0° to the inclination angle θ=10°, when the inclination angle θ is made large, a drop of the maximum phase αmax can be suppressed.

In the embodiment explained above, when the inclination angle was made larger in the range from the inclination angle θ=0° to the inclination angle θ=10°, the maximum phase αmax tended to become larger. However, it is considered that, in the SAW element 1 in the present modification, use is made of a bonded substrate, therefore a waveguide deemed to have the substrate 30 as the core and the support substrate 10 as the cladding is formed, a frequency band other than a certain specific frequency becomes a forbidden band prohibiting the propagation of the acoustic wave inside the substrate 30.

Accordingly, in a frequency band other than a certain specific frequency, the acoustic wave becomes harder to leak to the internal portion of the substrate 30, so the propagation loss due to leakage of the acoustic wave into the substrate 30 becomes small. Accordingly, in the SAW element 1 in the present modification, the propagation loss is small from the case where the inclination angle θ equals 0 degree. It is considered that as a result the maximum phase αmax becomes harder to become larger even if the inclination angle is made larger in the range from the inclination angle θ=0° to the inclination angle θ=10°, and the change is small. Note that, at the specific frequency explained before, the acoustic wave propagates in the substrate 30, and the influence thereof appears as a spurious emission on the impedance characteristic.

FIGS. 11A to 11D are graphs showing the impedance characteristics of the SAW element 1 using the 46° YX—LiTaO$_3$ for the substrate 30 where the inclination angles θ are set to 0 degree and 6 degree. In FIGS. 11A to 11D, the dotted lines indicate the SAW element where the inclination angle θ is 0 degree, and the solid lines indicate the SAW element where the inclination angle θ is 6 degrees. The abscissas show the frequency "f".

Figure 11A:
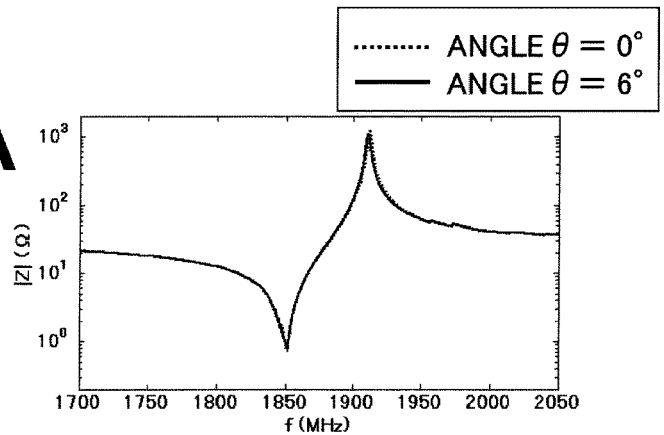
FIGS. 11A to 11D are diagrams showing results when the acoustic wave element in FIG. 8 is prepared and measured.
Figure 11B:
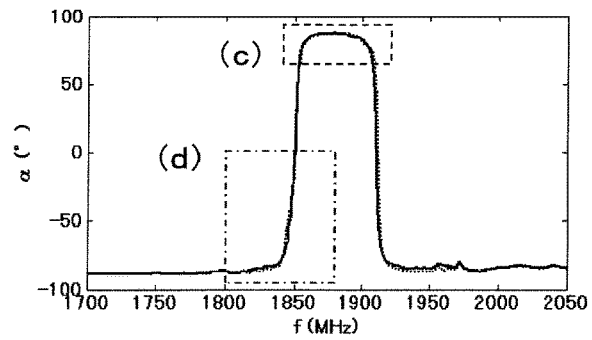
Figure 11C:
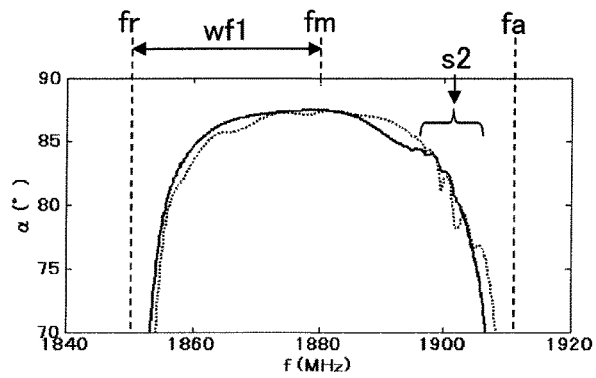
Figure 11D:
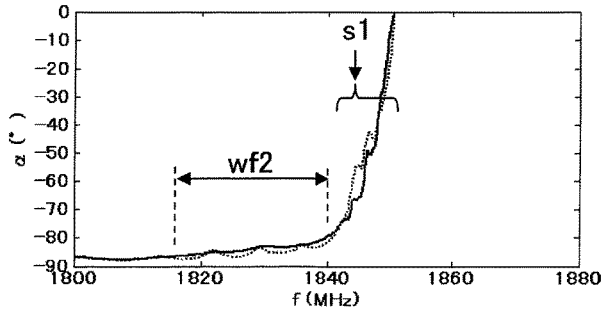

In FIG. 11A, the ordinate indicates the absolute value |Z| of the impedance. In FIG. 11B, the ordinate shows the phase α of the impedance Z. FIG. 11C is a graph enlarging the portion surrounded by the dotted line in FIG. 11B. FIG. 11D is a graph enlarging the portion surrounded by the one-dot chain line in FIG. 11B.

When the inclination angle θ is 0 degree, at a certain specific frequency which is indicated by s1 in FIG. 11D or by s2 in FIG. 11C, it is seen that spurious emissions are generated on the impedance characteristic. These are the spurious emissions which are generated when using a bonded substrate. This is a phenomenon occurring due to a thickness of the substrate 30 or the like, the specific frequencies or the intervals between spurious emissions change.

It is seen from this result that, compared with the case where the inclination angle θ is 0 degree, the spurious emissions are reduced in the case where the inclination angle θ is 6 degrees. That is, by inclining the first imaginary line L1 connecting the end portions of the plurality of first electrode fingers 23A and the second imaginary line L2 connecting the end portions of the plurality of second electrode fingers 23B relative to the propagation direction of the acoustic wave, Δf can be made small, and the steepness of the filter characteristics can be improved. In addition, according to such a configuration, the effect of reducing the spurious emissions of the bulk wave which are generated in the bonded substrate 300 is obtained.

Further, by inclining the first imaginary line L1 and second imaginary line L2 in the same direction as the propagation direction of the acoustic wave, differences of the cross range (crossing width W (FIG. 1)) of the pluralities of electrode fingers 23 can be suppressed, and the durability when applying a high electric power can be improved.

The phenomenon that, in the frequency band wf1 in the range from the resonance frequency to substantially the intermediate frequency fm between the resonance frequency fr and the anti-resonance frequency fa, for example the propagation loss is smaller in the case where the inclination angle θ is 6 degrees than the case where the inclination angle θ is 0 degree, and the phenomenon that the propagation loss becomes larger in a frequency band wf2 (not shown) from approximately a frequency higher than the anti-resonance frequency fa to the stop band end frequency fb (not shown) are the same as those in the embodiment explained above.

(Preferred Range of Inclination Angle θ)

Figure 12:
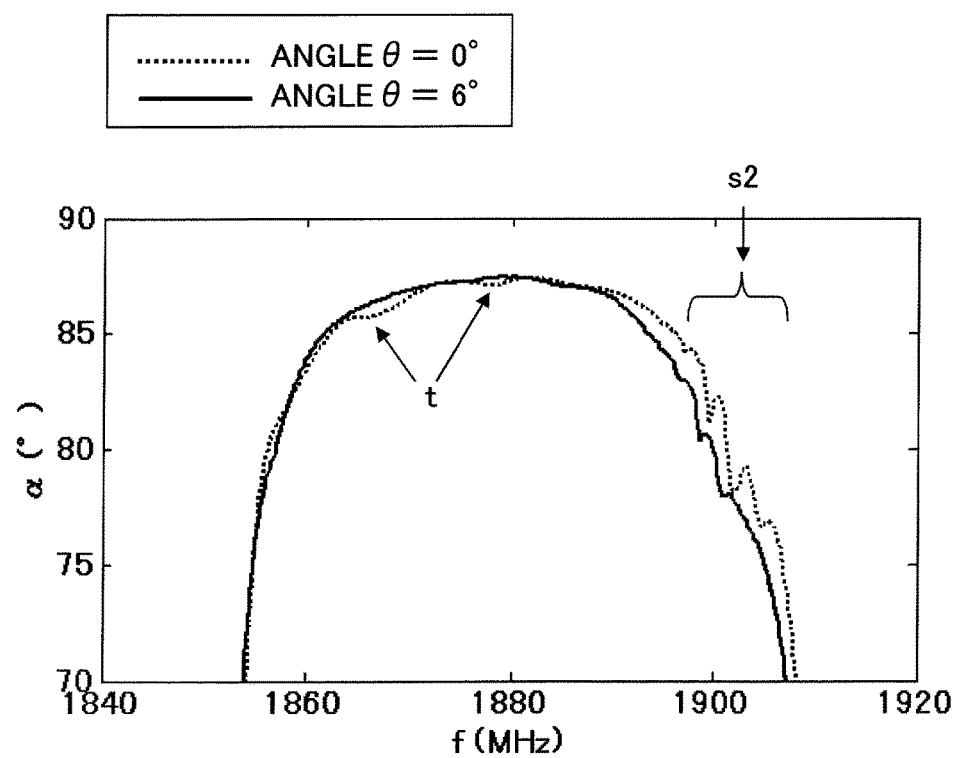
FIG. 12 is a diagram showing results when the acoustic wave element in FIG. 8 is prepared and measured.

FIG. 12 is a graph showing the impedance characteristics of the SAW elements 1 using 46° YX—LiTaO$_3$ for the substrate 30 and having inclination angles θ of 0 degree and 2 degrees. Note that, the abscissa shows the frequency "f". The ordinate shows the phase α of the impedance Z. The dotted line indicates the SAW element where the inclination angle θ is 0 degree, and the solid line indicates the SAW element where the inclination angle θ is 2 degrees.

It is seen from this result that in the case where the inclination angle θ is set at 2 degrees, as shown in FIG. 12, the spurious emissions which are generated in the frequency domain indicated by the portion of s2 can be greatly reduced. Further, as shown in FIG. 12, in the case where the inclination angle θ is 0 degree, collapses of phase peculiar to a bonded substrate are generated in the portions of "t". However, it is seen that these collapses can be greatly reduced by setting the inclination angle θ at 2 degrees.

As described above, Δf can be made small by making the inclination angle θ large, therefore the steepness of the filter characteristics can be improved. Further, by setting the inclination angle θ as 2°<θ≤10°, Δf can be made small, and the maximum phase αmax can be made large. As a result, the SAW element in which the steepness of the filter characteristics can be made high and the propagation loss is reduced in the frequency band wf1 can be obtained.

In addition, a SAW element having such a configuration can suppress the peculiar spurious emission which is generated when using a bonded substrate, therefore an excellent SAW element causing small frequency movement due to a temperature change is obtained.

Figure 13:
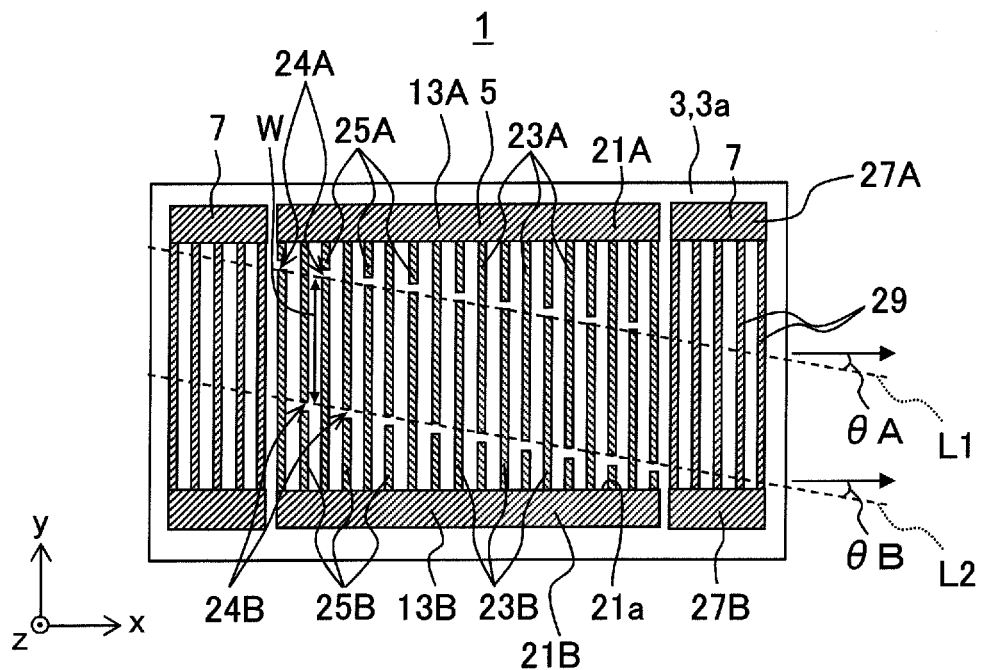
FIG. 13 is a plan view showing the configuration of a modification of the acoustic wave element in FIG. 1.

In the embodiment explained above, the case where the bus bars 21 were inclined matching with the inclination of the first imaginary line L1 and second imaginary line L2 was shown. However, as shown in FIG. 13, the bus bars 21 need not be inclined matching with the first imaginary line L1 and second imaginary line L2 either. In this case, by adjusting the lengths of the electrode fingers 23 and dummy electrode fingers 25, they may be arranged so that the end portions of the electrode fingers 23 are along the first imaginary line L1 and second imaginary line L2 while keeping the crossing width constant.

(Modification 2 of SAW Element)

Figure 14:
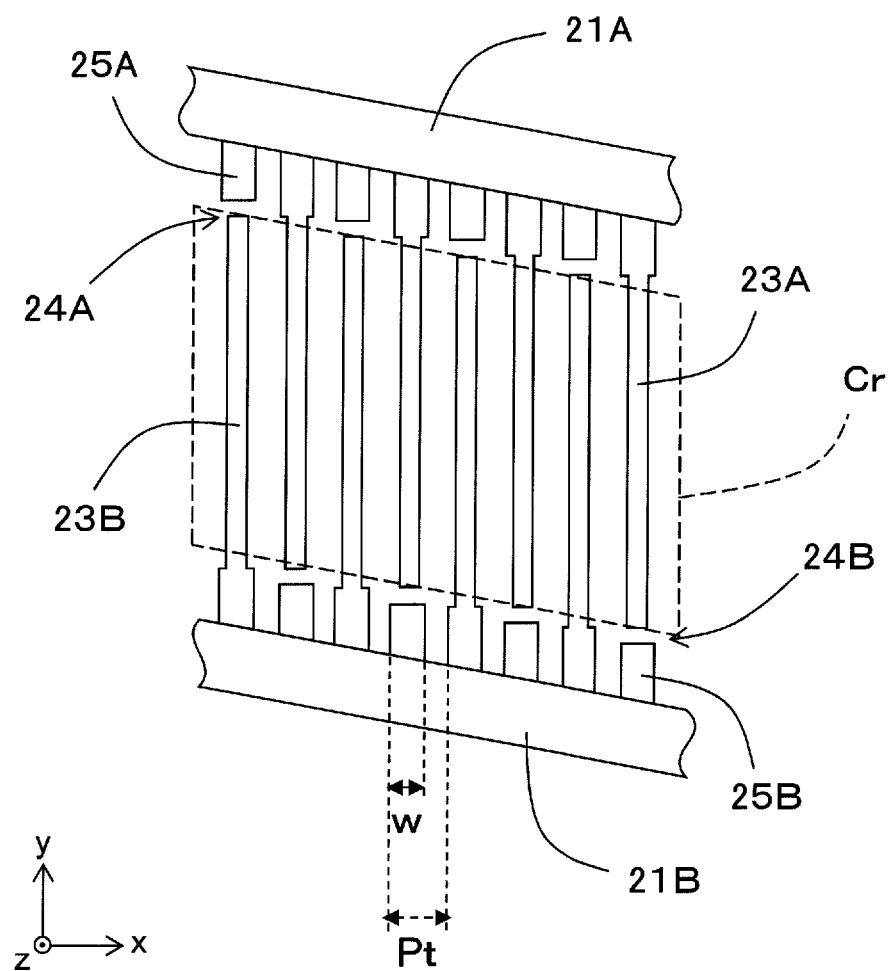
FIG. 14 is a plan view showing the configuration of an acoustic wave element according to a modification of one embodiment of the present invention.

The widths of the first dummy electrode fingers 25A may become larger than the widths of the second electrode fingers 23B as shown in FIG. 14. At this time, the widths of the second dummy electrode fingers 25B are also configured so as to become larger than the widths of the first electrode fingers 23A.

Figure 15A:
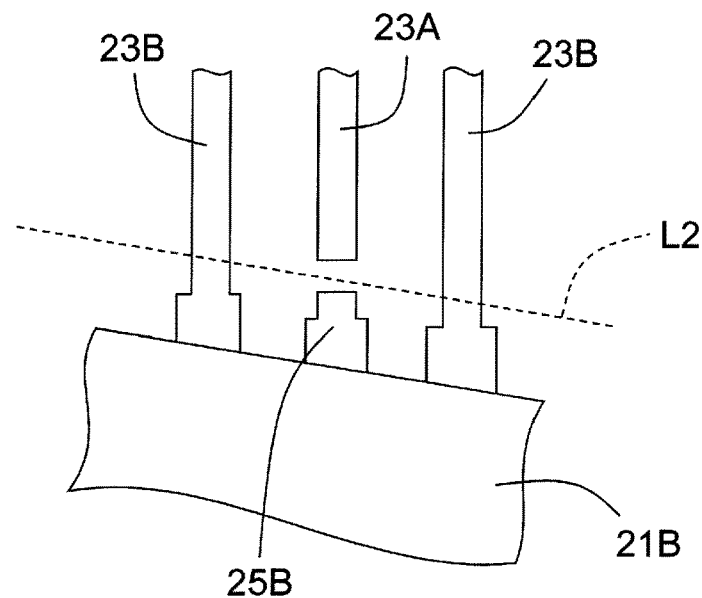
FIGS. 15A and 15B are plan views showing the configuration of an acoustic wave element according to a modification of one embodiment of the present invention and an enlarged plan views enlarging a portion of the acoustic wave element in FIG. 14.
Figure 15B:
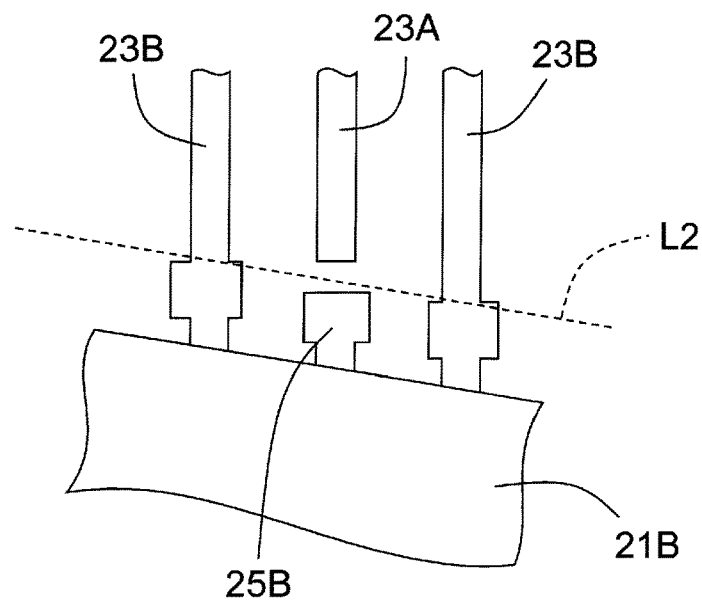

The widths of the first dummy electrode fingers 25A and second dummy electrode fingers 25B are configured to become larger in the x-axis direction. The first dummy electrode fingers 25A and second dummy electrode fingers 25B may have wide widths as a whole as shown in FIG. 14 or may have wide widths in portions as shown in FIGS. 15A and 15B. That is, as shown in FIG. 15A, portions of the second dummy electrode fingers 25B on the second bus bar 21B side may have wide widths as well. As shown in FIG. 15B, portions of the second dummy electrode fingers 25B on the second electrode finger 23A side may have wide widths. Further, as shown in FIG. 14 and FIGS. 15A and 15B, portions of the first electrode fingers 23A and second electrode fingers 23B may have wide widths as well.

The widths of the first electrode fingers 23A are set larger at the outside of the crossing region Cr of the first electrode fingers 23A and the second electrode fingers 23B than the widths at the positions inside the crossing region Cr. Further, also the widths of the second electrode fingers 23B are set larger at the outside of the crossing region Cr than the widths of the second electrode fingers 23B positioned in the crossing region Cr. Note that, in the following explanation, the portions in which the widths of the dummy electrode fingers 25 and electrode fingers 23 become large will be sometimes referred to as "wide width portions".

The wide width portions of parts of the electrode fingers 23 and the dummy electrode fingers 25 are set so that the duty Dt becomes larger relative to the duty Dt of the electrode fingers 23 in the crossing region Cr. As the duty Dt is made larger, as will be explained later, a greater effect of reducing leakage of the acoustic wave to the outside of the IDT electrode 5 can be obtained. Here, the "duty Dt" means, as shown in FIG. 16, a value obtained by dividing the width "w" of the wide width portions of the dummy electrode finger 25 by the pitch Pt of the dummy electrode fingers 25 and the adjacent electrode fingers 23. That is, it can be calculated by duty Dt=width w/pitch Pt.

In the case of an inclined type resonator which is inclined relative to the propagation direction of the acoustic wave of the IDT electrode 5 as in the SAW element 1 in the present modification, as shown in FIG. 16, the dummy electrode fingers 25 and electrode fingers 23 outside of the crossing region Cr are positioned in the propagation direction of the acoustic wave in the longitudinal direction (x-axis direction). For this reason, by providing wide width portions in the dummy electrode fingers 25 and electrode fingers 23 outside of the crossing region Cr, the stop bands of the dummy electrode fingers 25 and electrode fingers 23 outside of the crossing region Cr can be moved to the low band side. Due to this, even on the frequency side which is lower by a few megahertz than the resonance frequency, the acoustic wave propagating in the longitudinal direction can be reflected with a high efficiency, therefore it is reduced that they pass through the dummy electrode fingers 25 and electrode fingers 23 outside of the crossing region Cr and then leak to the outer side from those. As a result, the loss near the resonance can be reduced.

In addition, by providing the dummy electrode fingers 25, the velocity (sound velocity) of the acoustic wave outside of the crossing region Cr can be made small with respect to the sound velocity of the acoustic wave inside the crossing region Cr, therefore leakage of the acoustic wave to the lateral direction (y-axis direction) can be reduced.

Figure 17A:
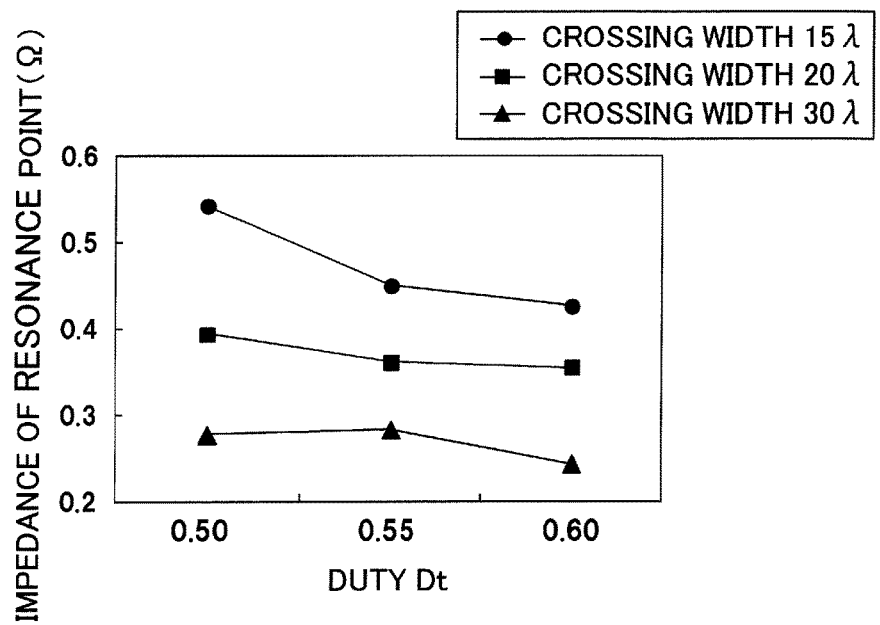
FIGS. 17A and 17B are diagrams showing results when the acoustic wave element in FIG. 14 is prepared and measured.
Figure 17B:
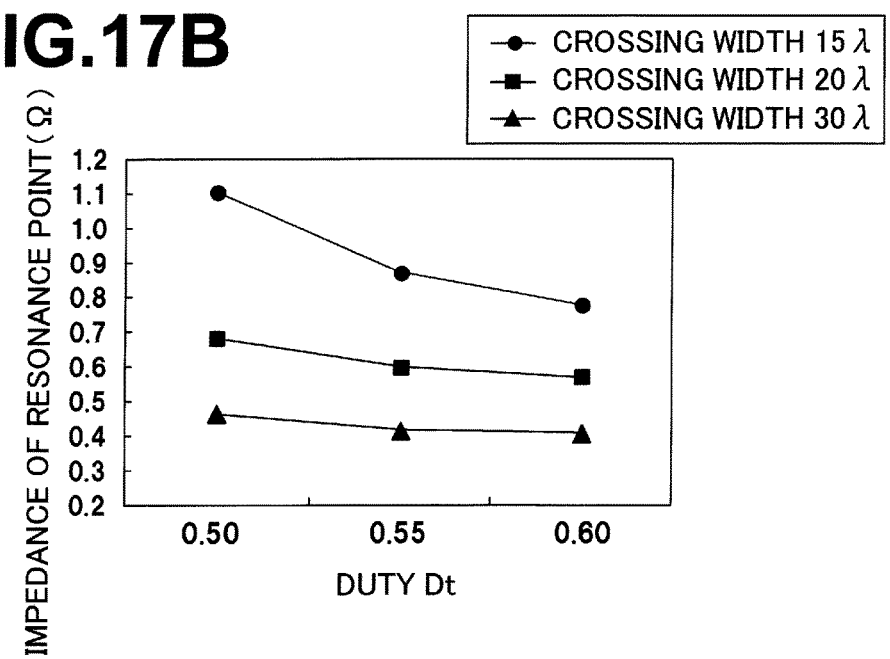

In order to confirm such an effect of the SAW element 1, a SAW element 1 provided with wide width portions in a portion of the electrode fingers 23 and in the dummy electrode fingers 25 was prepared, and the electrical characteristics were measured. The fundamental configuration is the same as that of the SAW element 1 in the embodiment explained above. FIG. 17A is a graph showing the measurement results of the SAW element 1 using the substrate of 42° YX—LiTaO$_3$, and FIG. 17B is a graph showing the measurement results of the SAW element 1 using a bonded substrate formed by bonding a support substrate made of silicon to the substrate of 46.3° YX—LiTaO$_3$. The abscissas indicate the duty Dt out of the crossing region Cr, and the ordinates show impedances at resonance points.

The results of this show that the impedances at the resonance points can be reduced and the loss of resonance points can be reduced in a case where the duty Dt of the dummy electrode fingers 25 and electrode fingers 23 outside of the crossing region Cr is changed from the 0.50 which is value in the crossing region Cr to 0.60. Further, it is seen by FIGS. 17A and 17B that, even in a case where the crossing width is changed to 15λ to 30λ, the same effects are obtained. In particular, it is seen that the shorter the crossing width, the larger the effect of reduction of loss at the resonance points.

(Summary of Configuration of SAW Module)

Figure 18:
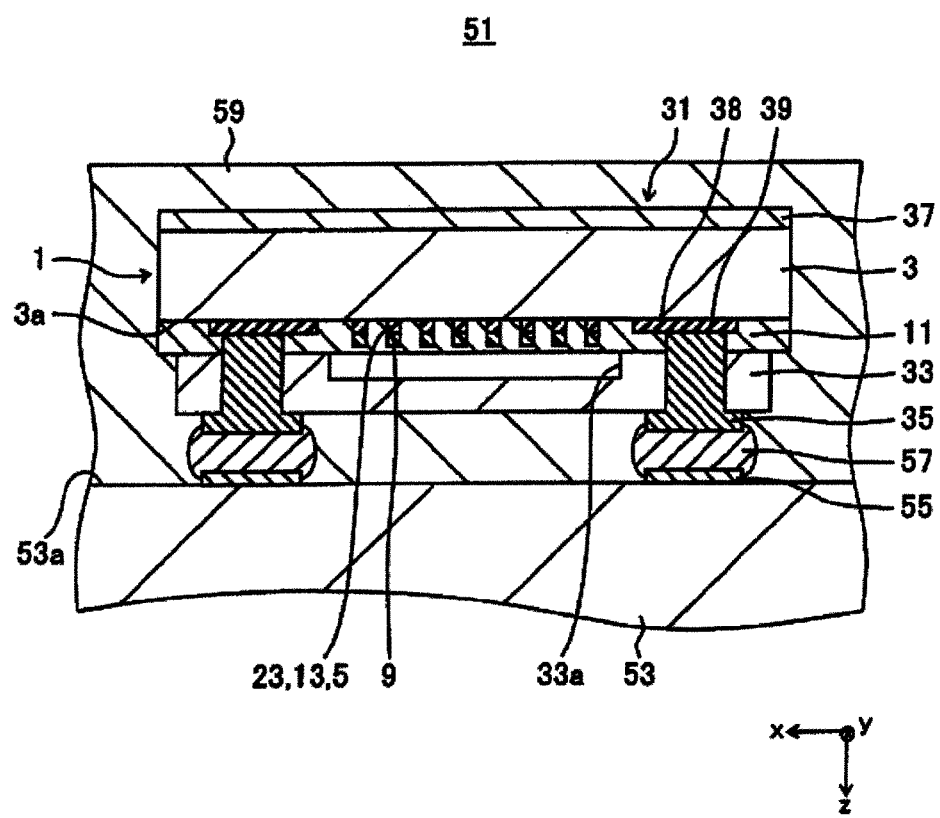
FIG. 18 is a cross-sectional view showing the configuration of an acoustic wave module formed by mounting the acoustic wave element in FIG. 1 on a circuit board.

FIG. 18 is a cross-sectional view showing an example of a SAW module 51 to which the SAW element 1 explained above is applied.

The SAW module 51 configures for example a filter element such as a branching filter. The SAW module 51 has a SAW element 31 and a circuit board 53 on which the SAW element 31 is mounted.

The SAW element 31 is for example configured as a wafer package level SAW element. The SAW element 31 has the SAW element 1 explained above, a cover 33 covering the SAW element 1 side of the substrate 3, terminals 35 penetrating through the cover 33, and a back-surface portion 37 covering the surface of the substrate 3 on the side opposite to the surface where the SAW element 1 is arranged.

The cover 33 is comprised of a resin or the like and forms a vibration space 33a on the upper side (positive side of z-direction) of the IDT electrode 5 and reflectors 7 for facilitating the propagation of the acoustic wave. On the upper surface 3a of the substrate 3, lines 38 which are connected to the IDT electrode 5 and pads 39 which are connected to the lines 38 are formed. The terminals 35 are formed on the pads 39 and are electrically connected to the IDT electrode 5. The back-surface portion 37 for example has a back electrode for discharging a charge formed on the surface of the substrate 3 due to a temperature change or the like and has a protective layer covering the back electrode.

The circuit board 53 is configured by for example a so-called rigid type printed circuit board. On the component side 53a of the circuit board 53, mounting pads 55 are formed.

The SAW element 31 is arranged so as to make the cover 33 side face the component side 53a. Further, the terminals 35 and the mounting pads 55 are bonded by solder 57. After that, the SAW element 31 is sealed by a sealing resin 59.

(Summary of Configuration of Filter Element)

Figure 19:
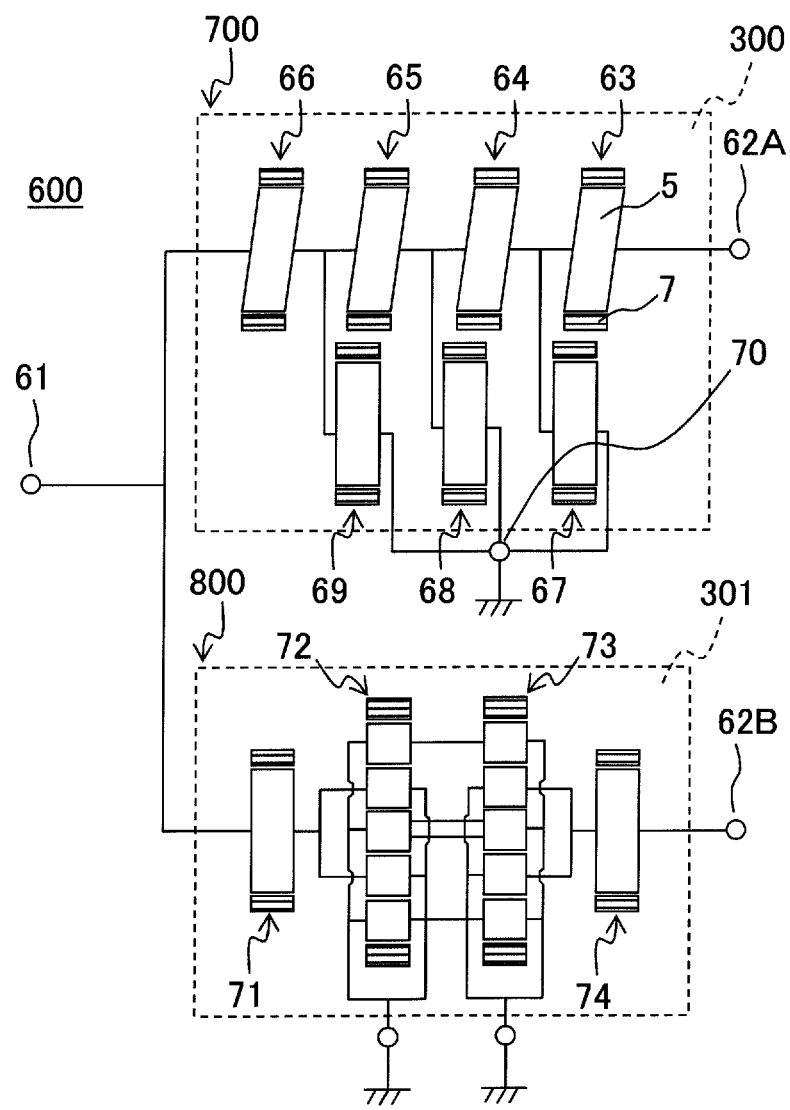
FIG. 19 is a diagram showing the circuit configuration of a filter element according to an embodiment of the present invention.

FIG. 19 is a schematic circuit diagram of a filter element 600 according to an embodiment of the present invention. The filter element 600 is configured by a first acoustic wave filter 700 including a ladder type filter circuit and a second acoustic wave filter 800 including a Double/Dual Mode SAW (DMS) type filter circuit. The passband of the first acoustic wave filter 700 is set so as to be positioned at a frequency lower than the passband of the second acoustic wave filter 800.

The first acoustic wave filter 700 is a ladder type filter which operates as a transmission band filter and is configured by electrically serially connected serial SAW elements 63, 64, 65, and 66 and electrically parallel connected parallel SAW elements 67, 68, and 69. The parallel SAW elements 67, 68, and 69 are connected to a ground terminal 70. Further, the serial SAW element 63 is connected to a transmission signal terminal 62A, and the serial SAW element 66 is connected to an antenna terminal 61. Note that, sometimes the serial SAW elements will be referred to as "serial resonators" and the parallel SAW elements will be referred to as "parallel resonators". Further, the serial resonators and parallel resonators have resonant electrode fingers of IDT electrode structure having first resonant electrode fingers and second resonant electrode fingers intersecting with each other. Note that, the resonant electrode fingers corresponds to the electrode fingers 23 explained above.

The second acoustic wave filter 800 operates as an reception band filter in which an antenna side SAW element 71 connected to the antenna terminal 61, first DMS type filter 72, second DMS type filter 73, and reception side SAW element 74 connected to a reception signal terminal 62B are connected in series.

For the case where the SAW element 1 of the embodiment explained above was used for the filter element 600, the transmission properties from the transmission signal terminal to the antenna terminal in the first acoustic wave filter 700 and acoustic wave filter 701 in the comparative example were found by computation by simulation.

In the first acoustic wave filter 700, use was made of a bonded substrate 300 shown below.

Bonded substrate 300:
Substrate 30
Type: 46° YX—LiTaO$_3$
Thickness: 20 μm
Support substrate 10
Type: Silicon
Thickness: 230 μm
Bonding method: Direct bonding Further, for the second acoustic wave filter 800, use was made of a bonded substrate 301 shown below.

Figure 20:
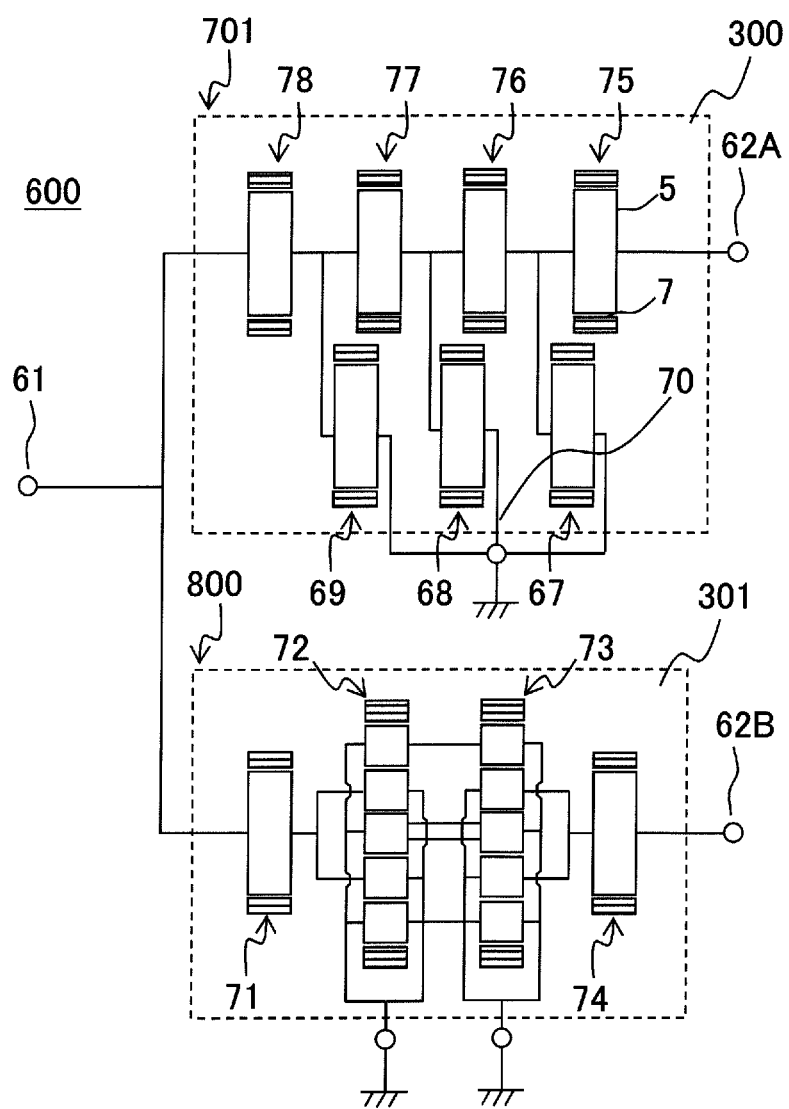
FIG. 20 is a diagram showing the circuit configuration of a filter element according to a comparative example.

Bonded substrate 301:
Substrate 3
Type: 42° YX—LiTaO$_3$
Thickness: 20 μm
Support substrate 10
Type: Silicon
Thickness: 230 μm
Bonding method: Direct bonding In the configurations of the filter elements for performing the simulation, the serial SAW elements 63, 64, 65, and 66 were set as SAW elements having the inclination angle θ of 6 degrees, the parallel SAW elements 67, 68, and 69 were set as SAW elements having the inclination angle θ of 0 degree, and thus the first acoustic wave filter 700 was set. Then, as in the comparative example, the first acoustic wave filter 701 as shown in FIG. 20 was set, in which all of the serial SAW elements 75, 76, 77, and 78, and parallel SAW elements 67, 68, and 69 were the SAW elements having the inclination angle θ of 0 degree. Note that, as the SAW element having the inclination angle θ of 0 degree, use may be made of a SAW element having the inclination angle θ of 0 degree to 2 degrees.

Figure 21A:
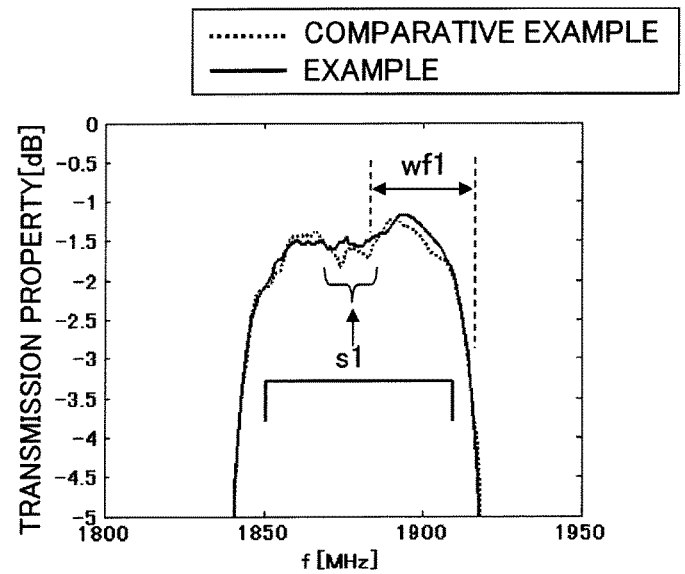
FIGS. 21A to 21C show results of computation of the filter elements in FIG. 18 and FIG. 19 by simulation.
Figure 21B:
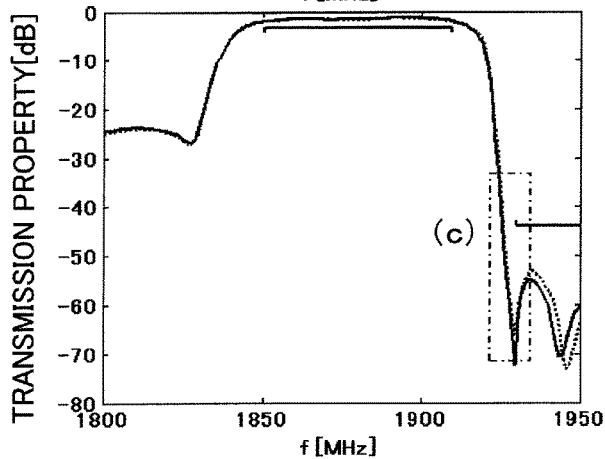
Figure 21C:
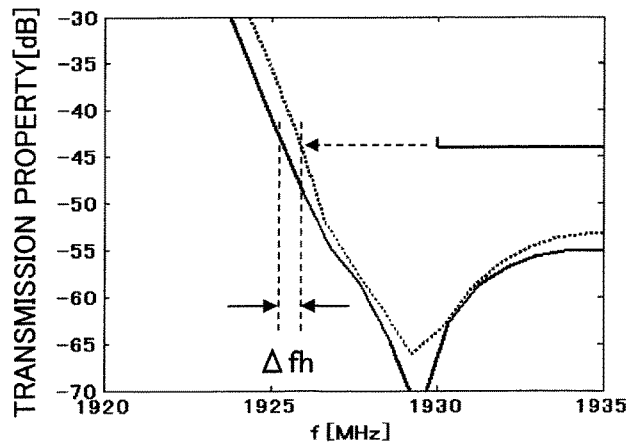

FIGS. 21A to 21C are graphs showing simulation results of transmission properties from the signal terminal 62A to the antenna terminal 61. The dotted lines in FIGS. 21A to 21C indicate the comparative example, and the solid lines indicate examples. The abscissas show the frequency "f". The ordinates show the transmission properties. FIG. 21A is a graph enlarging the vicinity of the transmission band, FIG. 21B is a graph showing the transmission property in the vicinity of the transmission band from 0 [dB] to −80 [dB], and FIG. 21C is a graph enlarging the portion surrounded by the one-dotted chain line in FIG. 21B.

It is seen that, in contrast to the comparative example, the examples show that the transmission properties of the serial SAW elements 63, 64, 65, and 66 becomes large in the frequency band within the frequency band wf1, and the loss in the passband of the filter characteristics is reduced.

Further, in the comparative example, in the serial SAW elements 63, 64, 65, and 66, spurious emissions are generated in the transmission property in the frequency band corresponding to the specific frequency s1 of spurious emissions which are generated when using a bonded substrate, so the loss in the filter characteristics becomes large. Contrary to this, the examples show that, according to the spurious emission reduction effect of the SAW element having the inclination angle θ of 6 degrees, generation of spurious emissions in the transmission property in the branching band corresponding to the specific frequency s1 is suppressed, and the loss in the filter characteristics is reduced. When the ambient temperature becomes high, the waveform of the transmission band filter moves to a low frequency side, and the transmission property of the frequency band wf1 becomes small, therefore increase in the transmission property in the frequency band wf1 contributes to improvement of quality of the filter element 600.

Further, a SAW element having an inclination angle θ of 6 degrees can make the Δf smaller compared with a SAW element having an inclination angle of 0 degree. Therefore, in a transmission property −44 [dB], a frequency difference Δfh between the comparative example and the examples is about 0.5 [MHz], therefore it is seen that the steepness of the transmission property is improved in the examples in contrast to the comparative example.

In the SAW element of the modification of one embodiment of the present invention, use is made of bonded substrates 300 for the first acoustic wave filter 700 in the examples and the first acoustic wave filter 701 in the comparative example. However, even in a case where use is made of the substrate 3 configured by a single layer of LiTaO$_3$ in place of the bonded substrate 300, compared with the comparative example, the examples show that the transmission properties of the serial SAW elements 63, 64, 65, and 66 in the frequency band within the frequency band wf1 become large, and the loss of the filter can be reduced. Further, a SAW element having an inclination angle θ of 6 degrees can make the Δf smaller compared with a SAW element having an inclination angle θ of 0 degree. Therefore, the examples can improve the steepness of the transmission property compared with the comparative example.

Further, even in a case where the SAW element 1 has a characteristic where the phase becomes large approximately at a frequency which becomes higher than the anti-resonance frequency fa as shown in FIG. 7D, by connecting the SAW element 1 in series to a serial arm, deterioration of the characteristics of the first acoustic wave filter 700 can be reduced.

(Modification 1 of Filter Element)

Figure 22:
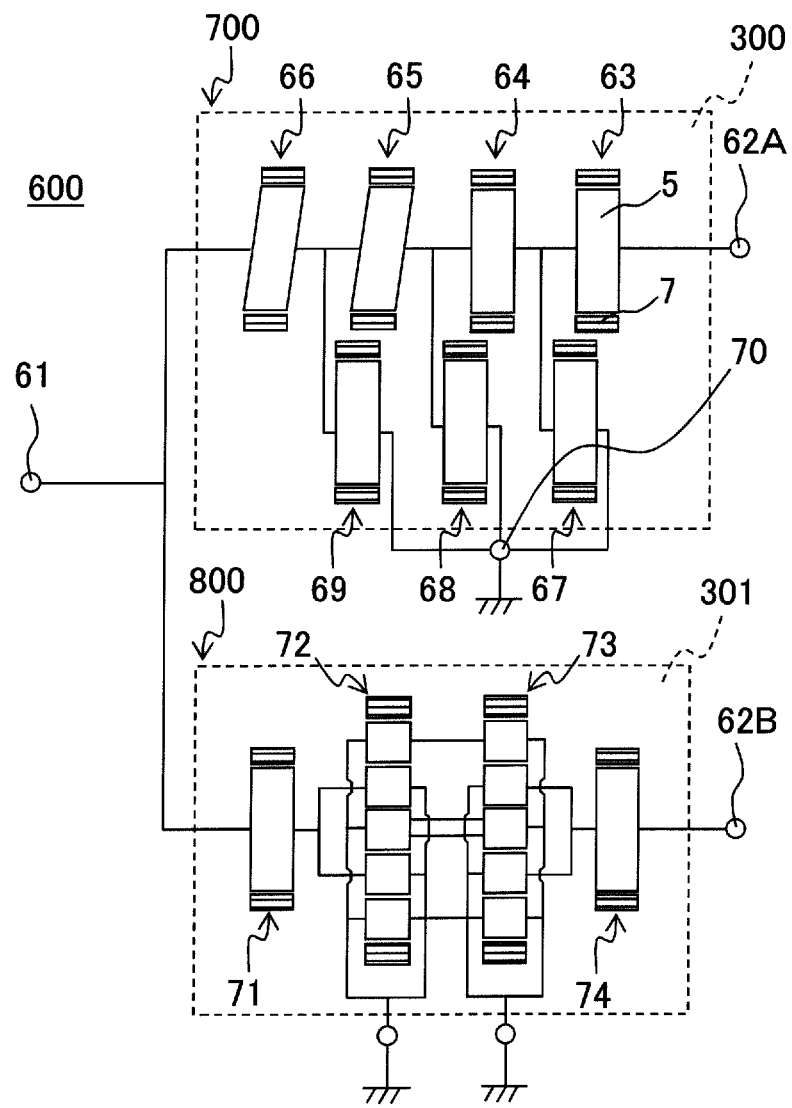
FIG. 22 is a diagram showing the circuit configuration of a filter element according to a modification of one embodiment of the present invention.

The filter element 600 in the embodiment explained above showed the case where the SAW element 1 was applied to all of the serial SAW elements 63, 64, 65, and 66, but there is a case where an adverse influence appears in the filter characteristics according to the design. For this reason, as shown in FIG. 22, the SAW element 1 may also be applied to only a portion of the serial SAW elements 63, 64, 65, and 66 as well. By applying the SAW element 1 to part of the serial SAW elements, a capacity element can be arranged with a high efficiency according to the design or the electrode fingers on the substrate 30 can be reduced in size in the design, therefore the degree of freedom in design on the substrate 30 can be improved.

Specifically, in the filter element 600 in the present modification, among the serial SAW elements 63, 64, 65, and 66, by applying the SAW element 1 in the present embodiment as the inclined type resonator to the SAW elements 65 and 66 having the minimum pitch Pt and applying an ordinary SAW element to the serial SAW elements 63 and 64, a sufficient effect is obtained (the transmission property in the frequency band within the frequency band wf1 becomes large, and the steepness of the transmission property is improved).

On the other hand, in a case where the configuration of the SAW element 1 is applied to all of the serial SAW elements (Comparative Example 2), the transmission property in the frequency area within the frequency band wf1 becomes better, but the steepness of the transmission property is not improved, and then as an adverse influence, the transmission property in the frequency area within a frequency band wf2 which will be explained later sometimes becomes small. This is because, as shown in FIG. 11D, in the frequency band wf2 positioned in the lower frequency area than the resonance point of the SAW element 1, the propagation loss becomes a bit large. When the SAW element 1 is applied to serial SAW elements having a large pitch Pt, the frequency band wf2 of the serial SAW elements having a large pitch Pt is positioned on the low frequency side in the passband of the filter characteristic, therefore the quality of the filter element 600 is sometimes lowered.

Figure 23A:
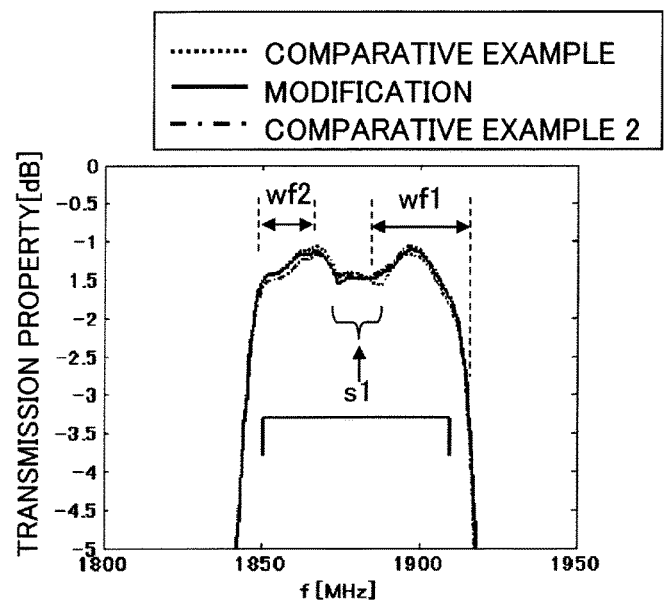
FIGS. 23A to 23C show results of computation of the filter characteristics of the filter element in FIG. 22 by simulation.
Figure 23B:
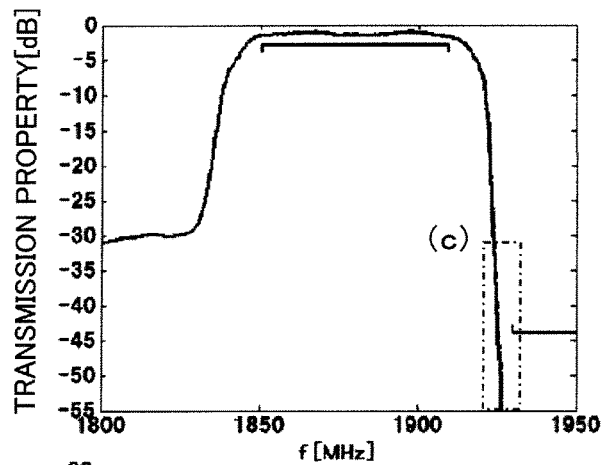
Figure 23C:
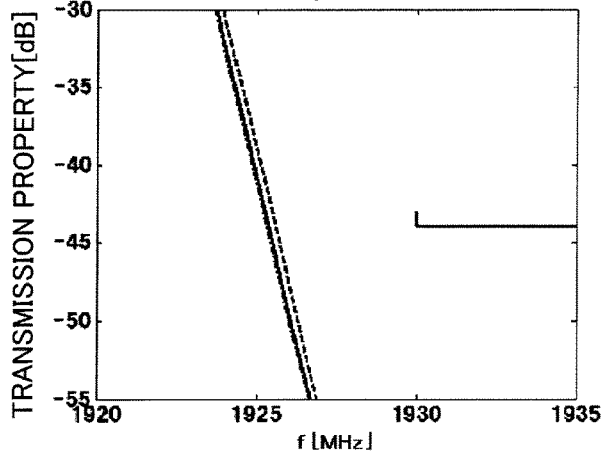

In order to confirm the effects of the filter element 600 in the present modification, the simulation of the filter element 600 was performed. The results of simulation will be shown by the graphs in FIGS. 23A to 23C. FIGS. 23B and 23C are enlargements of a portion near the end part on the high frequency side in the passband in FIG. 23A. It is seen from this result that the characteristics on the high frequency side in the passband can be improved. Note that, if the configuration of the SAW element 1 is applied to the SAW elements having the minimum pitch Pt among the serial SAW elements 63, 64, 65, and 66, high effects are obtained with a high efficiency.

Figure 24:
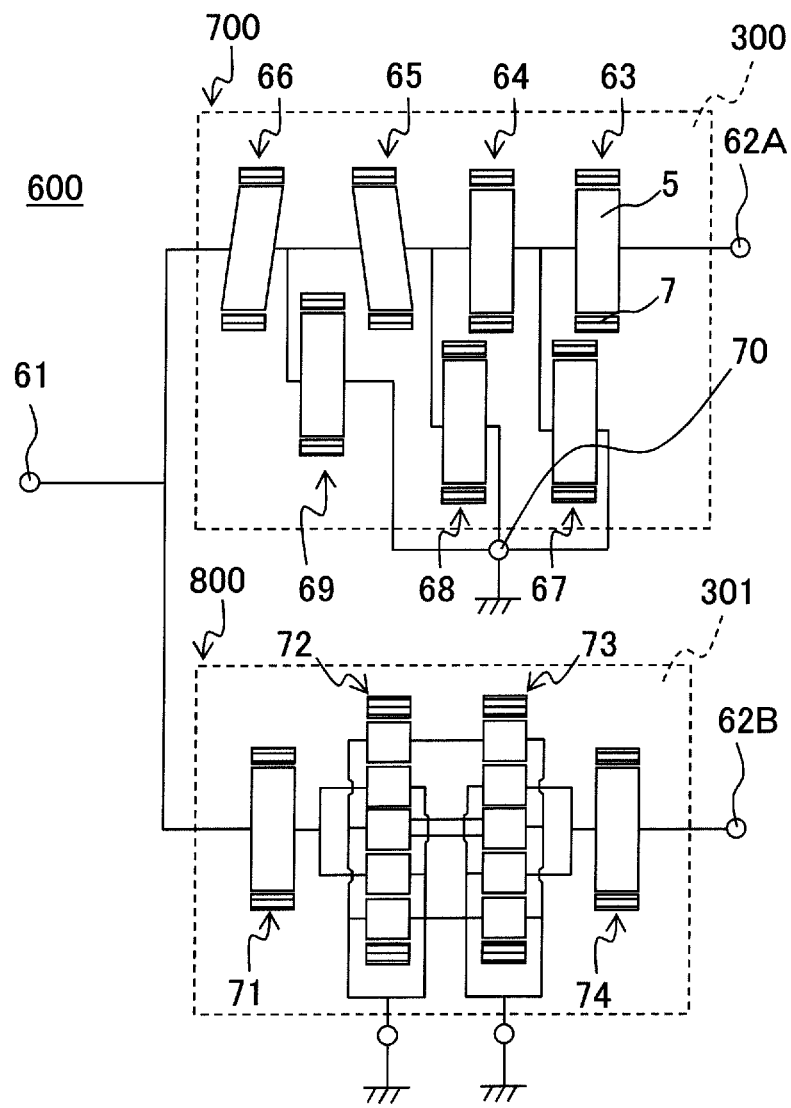
FIG. 24 is a plan view showing the configuration of a modification of the filter element in FIG. 22.

In the filter element 600 in the embodiment explained above or the filter element 600 in the modification, when using a plurality of SAW elements 1 in the present embodiment, use was made of a configuration in which the IDT electrodes 5 were inclined in the same direction relative to the propagation direction of the acoustic wave. However, as shown in FIG. 24, they may be inclined relative to the propagation direction of the acoustic wave in directions different from each other as well. FIG. 24 shows a case where use is made of SAW elements 1 in which, in the serial SAW elements 65 and 66, the IDT electrodes 5 (arrangements of electrode fingers 23) are inclined in directions different from each other.

By using SAW elements 1 in which the IDT electrodes 5 (arrangements of electrode fingers 23) are inclined in different directions in this way for the serial resonators, the degree of freedom in design on the piezoelectric substrate 300 can be raised. That is, for example, in the filter element 600 exemplified in FIG. 24, by inclination of the IDT electrodes 5 (arrangements of electrode fingers 23) in the SAW elements 1 which are applied to the serial resonators 65 and 66 in directions different from each other, a space is formed between the two. For this reason, the parallel resonator 69 can be arranged in this space. As a result, the filter element 600 can be reduced in size.

(Modification 2 of Filter Element)

Further, a capacity element may be connected parallel to at least one among the serial SAW elements 63, 64, 65, and 66 as well. For example, in the SAW element 1 according to the modification 1, the pitch Pt becomes small among the serial SAW elements 63, 64, 65, and 66. Therefore, by connecting the capacity element parallel to the SAW element 1, the anti-resonance point of the SAW element 1 moves to the low frequency side. Due to this, the anti-resonance point of the SAW element 1 is positioned near the end part of the high frequency side, therefore the steepness of the passband can be further improved. As the capacity element, for example, comb-shaped electrodes can be arranged on the substrate 2.

<Communication Device>

The filter element 600 in the embodiment explained above is used in a communication device having an antenna and an RF-IC controlling the filter element 600. The antenna is connected to the antenna terminal 61, while the RF-IC is electrically connected to the transmission signal terminal 62A and reception signal terminal 62B of the filter element 600. Such a communication device has a high steepness of the filter element 600, therefore can reduce noise or crosstalk, so can improve the quality of communication.

The invention claimed is:

1. An acoustic wave element, comprising:
   a piezoelectric substrate; and
   an IDT (InterDigital Transducer) electrode which is located on an upper surface of the piezoelectric substrate and excites an acoustic wave, wherein
   the IDT electrode comprises
      a first bus bar and a second bus bar which face each other in a direction crossing a propagation direction of the acoustic wave,
      a plurality of first electrode fingers which extend from the first bus bar to a side of the second bus bar, and
      a plurality of second electrode fingers which extend from the second bus bar to a side of the first bus bar and have portions that are adjacent to the plurality of first electrode fingers in the propagation direction, and
      a first imaginary line connecting end portions of the plurality of first electrode fingers in the IDT electrode of the side of the second bus bar, and a second imaginary line connecting end portions of the plurality of second electrode fingers in the IDT electrode of the side of the first bus bar are within ranges of
      2 degrees<θA≤10 degrees and
      2 degrees<θB≤10 degrees
   where an angle formed by the first imaginary line and the propagation direction is the first inclination angle θA and an angle formed by the second imaginary line and the propagation direction is the second inclination angle θB,
   wherein the piezoelectric substrate is made of $LiTaO_3$ and on a surface of the piezoelectric substrate on the opposite side to the surface on which the IDT electrode is located, a support substrate having a smaller thermal expansion coefficient than a thermal expansion coefficient of the piezoelectric substrate is located.

2. The acoustic wave element according to claim 1, wherein the piezoelectric substrate is comprised of 36° to 48° Y-X cut $LiTaO_3$.

3. The acoustic wave element according to claim 1, wherein the first imaginary line and the second imaginary line are inclined in the same direction relative to the propagation direction of the acoustic wave.

4. The acoustic wave element according to claim 1, wherein
   the first bus bar has first dummy electrode fingers which extend toward the second electrode fingers, and
   the second bus bar has second dummy electrode fingers which extend toward the first electrode fingers.

5. The acoustic wave element according to claim 4, wherein widths of the first dummy electrode fingers are larger than widths of the second electrode fingers, and widths of the second dummy electrode fingers are larger than widths of the first electrode fingers.

6. The acoustic wave element according to claim 1, wherein widths of the first electrode fingers at the outside of a crossing region of the first electrode fingers and the second electrode fingers are larger than widths of the first electrode fingers located at the inside of the crossing region, and the widths of the second electrode fingers at the outside of the crossing region are larger than widths of the second electrode fingers located at the inside of the crossing region.

7. The acoustic wave element according to claim 6, wherein a crossing width of the first electrode fingers and the second electrode fingers in the crossing region in a direction crossing the propagation direction is 15λ to 30λ where a wavelength of the acoustic wave is λ.

8. A filter element comprising the acoustic wave element according to claim 1, and further comprising a capacity element which is connected in parallel to the acoustic wave element.

9. A filter element, comprising:

the acoustic wave element according to claim 1; and a serial resonator connected in series to the acoustic wave element, and a parallel resonator connected in parallel to the acoustic wave element, which are located on the piezoelectric substrate.

10. The filter element according to claim 9, wherein the serial resonator comprises resonant electrode fingers of an IDT electrode structure comprising a plurality of first resonant electrode fingers and a plurality of second resonant electrode fingers intersecting with each other, and intervals between centers of the first electrode fingers and the second electrode fingers in the IDT electrode of the acoustic wave element are smaller than intervals between centers of the first resonant electrode fingers and the second resonant electrode fingers among the resonant electrode fingers.

11. The filter element according to claim 10, comprising a plurality of the serial resonators, wherein the intervals between centers of the first electrode fingers and the second electrode fingers in the IDT electrode of the acoustic wave element are smaller than the intervals between centers of the first resonant electrode fingers and the second resonant electrode fingers among the resonant electrode fingers of any of the serial resonators.

12. The filter element according to claim 10, wherein angles formed by a third imaginary line connecting end portions of the plurality of first resonant electrode fingers and by a fourth imaginary line connecting end portions of the plurality of second resonant electrode fingers of the serial resonator together with a propagation direction of an acoustic wave of the serial resonator are respectively in a range from 0 degree to 2 degrees.

13. The filter element according to claim 9, comprising a plurality of the acoustic wave elements.

14. The filter element according to claim 13, wherein the plurality of acoustic wave elements are inclined relative to the propagation direction of the acoustic wave in directions different from each other.

15. A communication device, comprising:

an antenna;

the filter element according to claim 9 and electrically connected to the antenna; and an RF-IC electrically connected to the filter element.

16. A communication device according to claim 15, further comprising another filter element connected to the antenna and comprising a DMS (Double/Dual Mode Surface Acoustic Wave) type filter.

17. The filter element according to claim 1, further comprising a $SiO_2$ layer between the piezolelectric substrate and the support substrate.

* * * * *